United States Patent
Crisp et al.

(10) Patent No.: US 8,917,532 B2
(45) Date of Patent: *Dec. 23, 2014

(54) STUB MINIMIZATION WITH TERMINAL GRIDS OFFSET FROM CENTER OF PACKAGE

(71) Applicant: Invensas Corporation, San Jose, CA (US)

(72) Inventors: Richard Dewitt Crisp, Hornitos, CA (US); Wael Zohni, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 143 days.

This patent is subject to a terminal disclaimer.

(21) Appl. No.: 13/644,012

(22) Filed: Oct. 3, 2012

(65) Prior Publication Data

US 2013/0083584 A1    Apr. 4, 2013

Related U.S. Application Data

(60) Provisional application No. 61/542,495, filed on Oct. 3, 2011.

(51) Int. Cl.
*G11C 5/06* (2006.01)
*H05K 1/02* (2006.01)
(Continued)

(52) U.S. Cl.
CPC . *H01L 23/49838* (2013.01); *H01L 2224/04042* (2013.01); *H05K 2201/10545* (2013.01); *H01L 2224/32225* (2013.01); *H01L 2924/157* (2013.01); *H01L 2224/73215* (2013.01);
(Continued)

(58) Field of Classification Search
CPC ...... G11C 5/04; H01L 23/50; H01L 23/4822; H01L 23/49838
USPC .......................................................... 365/63
See application file for complete search history.

(56) References Cited

U.S. PATENT DOCUMENTS 3,670,208 A    6/1972  Hovnanian et al.
4,747,081 A    5/1988  Heilveil et al.
(Continued)

FOREIGN PATENT DOCUMENTS

EP    1205977 A2    5/2002
JP    64-001257 A   1/1989
(Continued)

OTHER PUBLICATIONS

Elpida User's Manual, "Introduction to GDDR5 SGRAMM", Document No. E1600E10 (Ver. 1.0), Published Mar. 2010, Japan, URL: http:www.elpida.com.

(Continued)

*Primary Examiner* — Huan Hoang
*Assistant Examiner* — Pablo Huerta
(74) *Attorney, Agent, or Firm* — Lerner, David, Littenberg, Krumholz & Mentlik, LLP

(57) ABSTRACT

A microelectronic package includes a microelectronic element having memory storage array function overlying a first surface of a substrate, the microelectronic element having a plurality of contacts aligned with an aperture in the substrate. First terminals which are configured to carry all address signals transferred to the package can be exposed within a first region of a second substrate surface, the first region disposed between the aperture and a peripheral edge of the substrate. The first terminals may be configured to carry all command signals, bank address signals and command signals transferred to the package, the command signals being write enable, row address strobe, and column address strobe.

34 Claims, 11 Drawing Sheets

(51) Int. Cl.
  *G11C 5/04* (2006.01)
  *H01L 23/50* (2006.01)
  *H01L 23/13* (2006.01)
  *H01L 23/498* (2006.01)
  *H01L 23/482* (2006.01)
  *H05K 3/34* (2006.01)
  *H01L 23/00* (2006.01)
  *H01L 23/31* (2006.01)

(52) U.S. Cl.
  CPC ............... *H01L 2924/1436* (2013.01); *H01L 2924/15311* (2013.01); *H05K 1/0243* (2013.01); *G11C 5/04* (2013.01); *H01L 23/50* (2013.01); *H01L 2924/1434* (2013.01); *H05K 2201/10159* (2013.01); *H01L 2224/06156* (2013.01); *H01L 2924/1438* (2013.01); *H01L 23/13* (2013.01); *H01L 2924/15787* (2013.01); *H01L 23/4822* (2013.01); *H05K 3/3436* (2013.01); *H01L 2224/4824* (2013.01); *H01L 2224/06164* (2013.01); *H01L 24/48* (2013.01); *H01L 24/73* (2013.01); *H01L 2924/15788* (2013.01); *H01L 2924/1579* (2013.01); *H01L 23/3128* (2013.01); *H01L 24/32* (2013.01); *H01L 24/06* (2013.01)
  USPC .................................................... 365/63

(56) References Cited

U.S. PATENT DOCUMENTS

| | | |
|---|---|---|
| 5,148,265 A | 9/1992 | Khandros et al. |
| 5,148,266 A | 9/1992 | Khandros et al. |
| 5,163,024 A | 11/1992 | Heilveil et al. |
| 5,210,639 A | 5/1993 | Redwine et al. |
| 5,480,840 A | 1/1996 | Barnes et al. |
| 5,679,977 A | 10/1997 | Khandros et al. |
| 5,777,391 A | 7/1998 | Nakamura et al. |
| 5,929,517 A | 7/1999 | Distefano et al. |
| 5,936,305 A | 8/1999 | Akram |
| 5,973,403 A | 10/1999 | Wark |
| 6,086,386 A | 7/2000 | Fjelstad et al. |
| 6,130,116 A | 10/2000 | Smith et al. |
| 6,197,665 B1 | 3/2001 | DiStefano et al. |
| 6,252,264 B1 | 6/2001 | Bailey et al. |
| 6,255,899 B1 | 7/2001 | Bertin et al. |
| 6,261,867 B1 | 7/2001 | Robichaud et al. |
| 6,297,960 B1 | 10/2001 | Moden et al. |
| 6,323,436 B1 | 11/2001 | Hedrick et al. |
| 6,343,019 B1 | 1/2002 | Jiang et al. |
| 6,376,769 B1 | 4/2002 | Chung |
| 6,380,318 B1 | 4/2002 | Saito et al. |
| 6,384,473 B1 | 5/2002 | Peterson et al. |
| 6,426,560 B1 | 7/2002 | Kawamura et al. |
| 6,433,422 B1 | 8/2002 | Yamasaki |
| 6,445,594 B1 | 9/2002 | Nakagawa et al. |
| 6,452,266 B1 | 9/2002 | Iwaya et al. |
| 6,461,895 B1 | 10/2002 | Liang et al. |
| 6,462,423 B1 | 10/2002 | Akram et al. |
| 6,560,134 B2 | 5/2003 | Brox et al. |
| 6,577,004 B1 | 6/2003 | Rumsey et al. |
| 6,611,057 B2 | 8/2003 | Mikubo et al. |
| 6,617,695 B1 | 9/2003 | Kasatani |
| 6,619,973 B2 | 9/2003 | Perino et al. |
| 6,620,648 B2 | 9/2003 | Yang |
| 6,633,078 B2 | 10/2003 | Hamaguchi et al. |
| 6,661,089 B2 | 12/2003 | Huang |
| 6,692,987 B2 | 2/2004 | Lim et al. |
| 6,707,141 B2 | 3/2004 | Akram |
| 6,720,666 B2 | 4/2004 | Lim et al. |
| 6,742,098 B1 | 5/2004 | Halbert et al. |
| 6,744,137 B2 | 6/2004 | Kinsman |
| 6,765,288 B2 | 7/2004 | Damberg |
| 6,781,220 B2 | 8/2004 | Taube et al. |
| 6,821,815 B2 | 11/2004 | Smith et al. |
| 6,836,007 B2 | 12/2004 | Michii et al. |
| 6,876,088 B2 | 4/2005 | Harvey |
| 6,894,379 B2 | 5/2005 | Feurle |
| 6,894,381 B2 | 5/2005 | Hetzel et al. |
| 6,906,415 B2 | 6/2005 | Jiang et al. |
| 6,943,057 B1 | 9/2005 | Shim et al. |
| 6,977,440 B2 | 12/2005 | Pflughaupt et al. |
| 6,982,485 B1 | 1/2006 | Lee et al. |
| 7,061,092 B2 | 6/2006 | Akram et al. |
| 7,061,105 B2 | 6/2006 | Masuda et al. |
| 7,061,121 B2 | 6/2006 | Haba |
| 7,091,064 B2 | 8/2006 | Jiang |
| 7,123,497 B2 | 10/2006 | Matsui et al. |
| 7,138,709 B2 | 11/2006 | Kumamoto |
| 7,145,226 B2 | 12/2006 | Kumamoto |
| 7,151,319 B2 | 12/2006 | Iida et al. |
| 7,170,158 B2 | 1/2007 | Choi et al. |
| 7,262,507 B2 | 8/2007 | Hino et al. |
| 7,272,888 B2 | 9/2007 | DiStefano |
| 7,294,928 B2 | 11/2007 | Bang et al. |
| 7,324,352 B2 | 1/2008 | Goodwin |
| 7,368,319 B2 | 5/2008 | Ha et al. |
| 7,372,169 B2 | 5/2008 | Chang |
| 7,389,937 B2 | 6/2008 | Ito |
| 7,405,471 B2 | 7/2008 | Kledzik et al. |
| 7,414,312 B2 | 8/2008 | Nguyen et al. |
| 7,476,975 B2 | 1/2009 | Ogata |
| 7,518,226 B2 | 4/2009 | Cablao et al. |
| 7,535,110 B2 | 5/2009 | Wu et al. |
| 7,550,842 B2 | 6/2009 | Khandros et al. |
| 7,589,409 B2 | 9/2009 | Gibson et al. |
| 7,633,146 B2 | 12/2009 | Masuda et al. |
| 7,633,147 B2 | 12/2009 | Funaba et al. |
| 7,642,635 B2 | 1/2010 | Kikuchi et al. |
| 7,692,931 B2 | 4/2010 | Chong et al. |
| 7,763,964 B2 | 7/2010 | Matsushima |
| 7,763,969 B2 | 7/2010 | Zeng et al. |
| RE41,478 E | 8/2010 | Nakamura et al. |
| RE41,721 E | 9/2010 | Nakamura et al. |
| RE41,722 E | 9/2010 | Nakamura et al. |
| 7,795,721 B2 | 9/2010 | Kurita |
| RE41,972 E | 11/2010 | Lenander et al. |
| 7,989,940 B2 | 8/2011 | Haba et al. |
| RE42,972 E | 11/2011 | Nakamura et al. |
| 8,138,015 B2 | 3/2012 | Joseph et al. |
| 8,278,764 B1 | 10/2012 | Crisp et al. |
| 8,338,963 B2 | 12/2012 | Haba et al. |
| 8,345,441 B1 | 1/2013 | Crisp et al. |
| 8,378,478 B2 | 2/2013 | Desai et al. |
| 8,405,207 B1 | 3/2013 | Crisp et al. |
| 8,436,457 B2 | 5/2013 | Crisp et al. |
| 8,436,477 B2 | 5/2013 | Crisp et al. |
| 8,441,111 B2 | 5/2013 | Crisp et al. |
| 8,502,390 B2 | 8/2013 | Crisp et al. |
| 8,513,813 B2 | 8/2013 | Crisp et al. |
| 8,513,817 B2 | 8/2013 | Haba et al. |
| 8,525,327 B2 | 9/2013 | Crisp et al. |
| 8,610,260 B2 | 12/2013 | Crisp et al. |
| 8,629,545 B2 | 1/2014 | Crisp et al. |
| 8,653,646 B2 | 2/2014 | Crisp et al. |
| 8,659,139 B2 | 2/2014 | Crisp et al. |
| 8,659,140 B2 | 2/2014 | Crisp et al. |
| 8,659,141 B2 | 2/2014 | Crisp et al. |
| 8,659,142 B2 | 2/2014 | Crisp et al. |
| 8,659,143 B2 | 2/2014 | Crisp et al. |
| 8,670,261 B2 * | 3/2014 | Crisp et al. ............... 365/51 |
| 2001/0002727 A1 | 6/2001 | Shiraishi et al. |
| 2001/0022740 A1 | 9/2001 | Nuxoll et al. |
| 2001/0038106 A1 | 11/2001 | Coteus et al. |
| 2002/0000583 A1 | 1/2002 | Kitsukawa et al. |
| 2002/0016056 A1 | 2/2002 | Corisis |
| 2002/0027019 A1 | 3/2002 | Hashimoto |
| 2002/0030261 A1 | 3/2002 | Rolda et al. |
| 2002/0053727 A1 | 5/2002 | Kimura |
| 2002/0053732 A1 | 5/2002 | Iwaya et al. |
| 2002/0066950 A1 | 6/2002 | Joshi |
| 2002/0171142 A1 | 11/2002 | Kinsman |
| 2003/0064547 A1 | 4/2003 | Akram et al. |

(56) References Cited

U.S. PATENT DOCUMENTS

| | | |
|---|---|---|
| 2003/0089978 A1 | 5/2003 | Miyamoto et al. |
| 2003/0089982 A1 | 5/2003 | Feurle |
| 2003/0107908 A1 | 6/2003 | Jang et al. |
| 2003/0205801 A1 | 11/2003 | Baik et al. |
| 2003/0211660 A1 | 11/2003 | Lim et al. |
| 2004/0016999 A1 | 1/2004 | Misumi |
| 2004/0061211 A1 | 4/2004 | Michii et al. |
| 2004/0061577 A1 | 4/2004 | Breisch et al. |
| 2004/0090756 A1 | 5/2004 | Ho et al. |
| 2004/0112088 A1 | 6/2004 | Ueda et al. |
| 2004/0145042 A1 | 7/2004 | Morita et al. |
| 2004/0164382 A1 | 8/2004 | Gerber et al. |
| 2004/0168826 A1 | 9/2004 | Jiang et al. |
| 2004/0184240 A1 | 9/2004 | Su |
| 2005/0116358 A1 | 6/2005 | Haba |
| 2005/0194672 A1 | 9/2005 | Gibson et al. |
| 2005/0206585 A1 | 9/2005 | Stewart et al. |
| 2005/0243590 A1 | 11/2005 | Lee et al. |
| 2005/0258532 A1 | 11/2005 | Yoshikawa et al. |
| 2006/0004981 A1 | 1/2006 | Bains |
| 2006/0081983 A1 | 4/2006 | Humpston et al. |
| 2006/0207788 A1 | 9/2006 | Yoon et al. |
| 2006/0290005 A1 | 12/2006 | Thomas et al. |
| 2007/0025131 A1 | 2/2007 | Ruckerbauer et al. |
| 2007/0108592 A1 | 5/2007 | Lai et al. |
| 2007/0120245 A1 | 5/2007 | Yoshikawa et al. |
| 2007/0143553 A1 | 6/2007 | LaBerge |
| 2007/0241441 A1 | 10/2007 | Choi et al. |
| 2007/0260841 A1 | 11/2007 | Hampel et al. |
| 2008/0012110 A1 | 1/2008 | Chong et al. |
| 2008/0052462 A1 | 2/2008 | Blakely et al. |
| 2008/0061423 A1 | 3/2008 | Brox et al. |
| 2008/0088033 A1 | 4/2008 | Humpston et al. |
| 2008/0098277 A1 | 4/2008 | Hazelzet |
| 2008/0150155 A1 | 6/2008 | Periaman et al. |
| 2008/0182443 A1 | 7/2008 | Beaman et al. |
| 2008/0185705 A1 | 8/2008 | Osborn et al. |
| 2008/0230888 A1 | 9/2008 | Sasaki |
| 2008/0256281 A1 | 10/2008 | Fahr et al. |
| 2008/0265397 A1 | 10/2008 | Lin et al. |
| 2009/0065948 A1 | 3/2009 | Wang |
| 2009/0108425 A1 | 4/2009 | Lee et al. |
| 2009/0200680 A1 | 8/2009 | Shinohara et al. |
| 2009/0250255 A1 | 10/2009 | Shilling et al. |
| 2009/0294938 A1 | 12/2009 | Chen |
| 2009/0314538 A1 | 12/2009 | Jomaa et al. |
| 2010/0052111 A1 | 3/2010 | Urakawa |
| 2010/0102428 A1* | 4/2010 | Lee et al. .................. 257/686 |
| 2010/0182040 A1 | 7/2010 | Feng et al. |
| 2010/0244272 A1 | 9/2010 | Lee et al. |
| 2010/0244278 A1 | 9/2010 | Shen |
| 2010/0295166 A1 | 11/2010 | Kim |
| 2010/0301466 A1 | 12/2010 | Taoka et al. |
| 2010/0327457 A1 | 12/2010 | Mabuchi |
| 2011/0042824 A1 | 2/2011 | Koide |
| 2011/0110165 A1 | 5/2011 | Gillingham et al. |
| 2011/0193178 A1 | 8/2011 | Chang et al. |
| 2011/0193226 A1 | 8/2011 | Kirby et al. |
| 2011/0254156 A1 | 10/2011 | Lin |
| 2012/0018863 A1 | 1/2012 | Oganesian et al. |
| 2012/0020026 A1 | 1/2012 | Oganesian et al. |
| 2012/0155049 A1 | 6/2012 | Haba et al. |
| 2012/0313239 A1 | 12/2012 | Zohni |
| 2012/0313253 A1 | 12/2012 | Nakadaira et al. |
| 2013/0015590 A1 | 1/2013 | Haba et al. |
| 2013/0082394 A1* | 4/2013 | Crisp et al. .................. 257/774 |
| 2013/0083583 A1* | 4/2013 | Crisp et al. .................. 365/63 |
| 2013/0168843 A1* | 7/2013 | Zohni .................. 257/706 |
| 2013/0286707 A1* | 10/2013 | Crisp et al. .................. 365/63 |
| 2013/0307138 A1* | 11/2013 | Crisp et al. .................. 257/734 |
| 2014/0042644 A1* | 2/2014 | Haba et al. .................. 257/777 |
| 2014/0055941 A1 | 2/2014 | Crisp et al. |
| 2014/0055942 A1 | 2/2014 | Crisp et al. |
| 2014/0055970 A1 | 2/2014 | Crisp et al. |

FOREIGN PATENT DOCUMENTS

| | | |
|---|---|---|
| JP | 2002-076252 A | 3/2002 |
| JP | 2004-063767 A | 2/2004 |
| JP | 2008-198841 A | 8/2008 |
| JP | 3143893 U | 8/2008 |
| JP | 2010-098098 A | 4/2010 |
| KR | 2001-0002214 A | 1/2001 |
| KR | 2005-0119414 A | 12/2005 |
| KR | 2006-0120365 A | 11/2006 |
| KR | 2007-0088177 A | 8/2007 |
| KR | 2009-0008341 A | 1/2009 |
| KR | 2009-0086314 A | 8/2009 |
| TW | 312044 | 8/1997 |
| TW | M338433 U | 8/2008 |
| TW | 200901194 A | 1/2009 |
| WO | 2010120310 A1 | 10/2010 |

OTHER PUBLICATIONS

Hynix, "2GB (64M×32) GDDR5 SGRAM HRGQ2H24AFR", Nov. 2011-Feb. 2012.
International Search Report and Written Opinion for Application No. PCT/US2012/046049 dated Jan. 10, 2013.
International Search Report and Written Opinion for Application No. PCT/US2012/046049 dated Nov. 29, 2012.
Kang, et al., 8Gb 3D DDR3 DRAM Using Through-Silicon-Via Technology, IEEE, International Solid-State Circuits Conference, 2009, pp. 130-132.
Kang, et al., 8Gb 3D DDR3 DRAM Using Through-Silicon-Via Technology, IEEE, International Solid-State Circuits Conference, 2009, Samsung Electronics, Hwasung, Korea.
Partial International Search Report dated Oct. 12, 2012 in International Patent Appl. No. PCT/US2012/046249.
Partial International Search Report dated Oct. 12, 2012 in International Patent Appl. No. PCT/US2012/046255.
Partial International Search Report dated Oct. 26, 2012 in International Patent Appl. No. PCT/US2012/046049.
Partial Search Report for Application No. PCT/US2012/000425 dated Jan. 30, 2013.
Partial Search Report for Application No. PCT/US2012/057170 dated Jan. 31, 2013.
Partial Search Report for Application No. PCT/US2012/057554 dated Jan. 24, 2013.
Partial Search Report for Application No. PCT/US2012/058273 dated Jan. 24, 2013.
Partial Search Report for Application No. PCT/US2012/058557 dated Feb. 4, 2013.
Sandforce, "SF-2200 & SF-2100 Client SSD Processors", 2011.
US Amendment for U.S. Appl. No. 13/439,299 dated Jan. 18, 2013.
U.S. Appl. No. 13/080,876, filed Apr. 6, 2011.
U.S. Appl. No. 13/306,300, filed Nov. 29, 2011.
U.S. Appl. No. 13/337,565, filed Dec. 27, 2011.
U.S. Appl. No. 13/337,575, filed Dec. 27, 2011.
U.S. Appl. No. 13/346,185, filed Jan. 9, 2012.
U.S. Appl. No. 13/439,228, filed Apr. 4, 2012.
U.S. Appl. No. 13/439,273, filed Apr. 4, 2012.
U.S. Appl. No. 13/439,299, filed Apr. 4, 2012.
U.S. Appl. No. 13/439,354, filed Apr. 4, 2012.
U.S. Appl. No. 13/440,199, filed Apr. 5, 2012.
U.S. Appl. No. 13/440,280, filed Apr. 5, 2012.
U.S. Appl. No. 13/440,290, filed Apr. 5, 2012.
U.S. Appl. No. 13/440,299, filed Apr. 5, 2012.
U.S. Appl. No. 13/440,515, filed Apr. 5, 2012.
U.S. Appl. No. 13/306,068, filed Nov. 29, 2011.
U.S. Appl. No. 13/346,201, filed Jan. 9, 2012.
U.S. Appl. No. 13/354,747, filed Jan. 20, 2012.
U.S. Appl. No. 13/354,772, filed Jan. 20, 2012.
U.S. Appl. No. 13/439,286, filed Apr. 5, 2012.
U.S. Appl. No. 13/439,317, filed Apr. 5, 2012.
U.S. Appl. No. 13/440,212, filed Apr. 5, 2012.
U.S. Appl. No. 13/440,313, filed Apr. 5, 2012.
US Non Final Office Action dated Oct. 18, 2012 for U.S. Appl. No. 13/439,299.

(56) References Cited

OTHER PUBLICATIONS

U.S. Appl. No. 13/839,402, filed Mar. 15, 2013.
U.S. Appl. No. 13/841,052, filed Mar. 15, 2013.
U.S. Appl. No. 13/840,542, filed Mar. 15, 2013.
U.S. Appl. No. 13/840,353, filed Mar. 15, 2013.
U.S. Appl. No. 61/477,877, filed Apr. 21, 2011.
Office Action from Taiwan for Application No. 101125197 dated May 19, 2014.

* cited by examiner

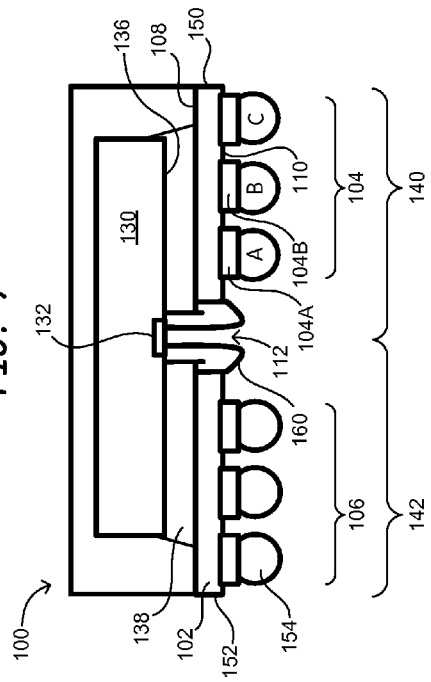
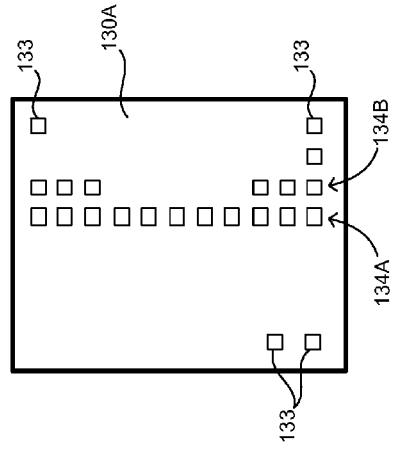
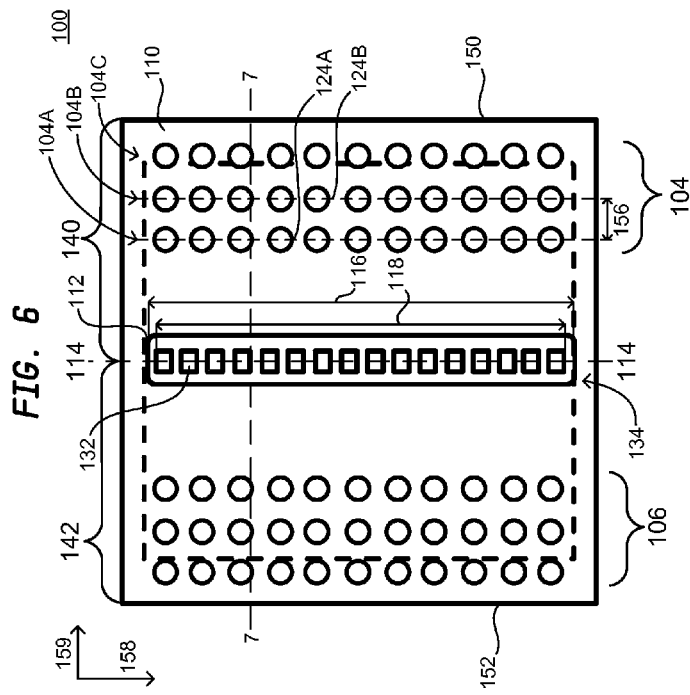
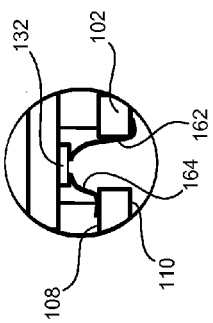

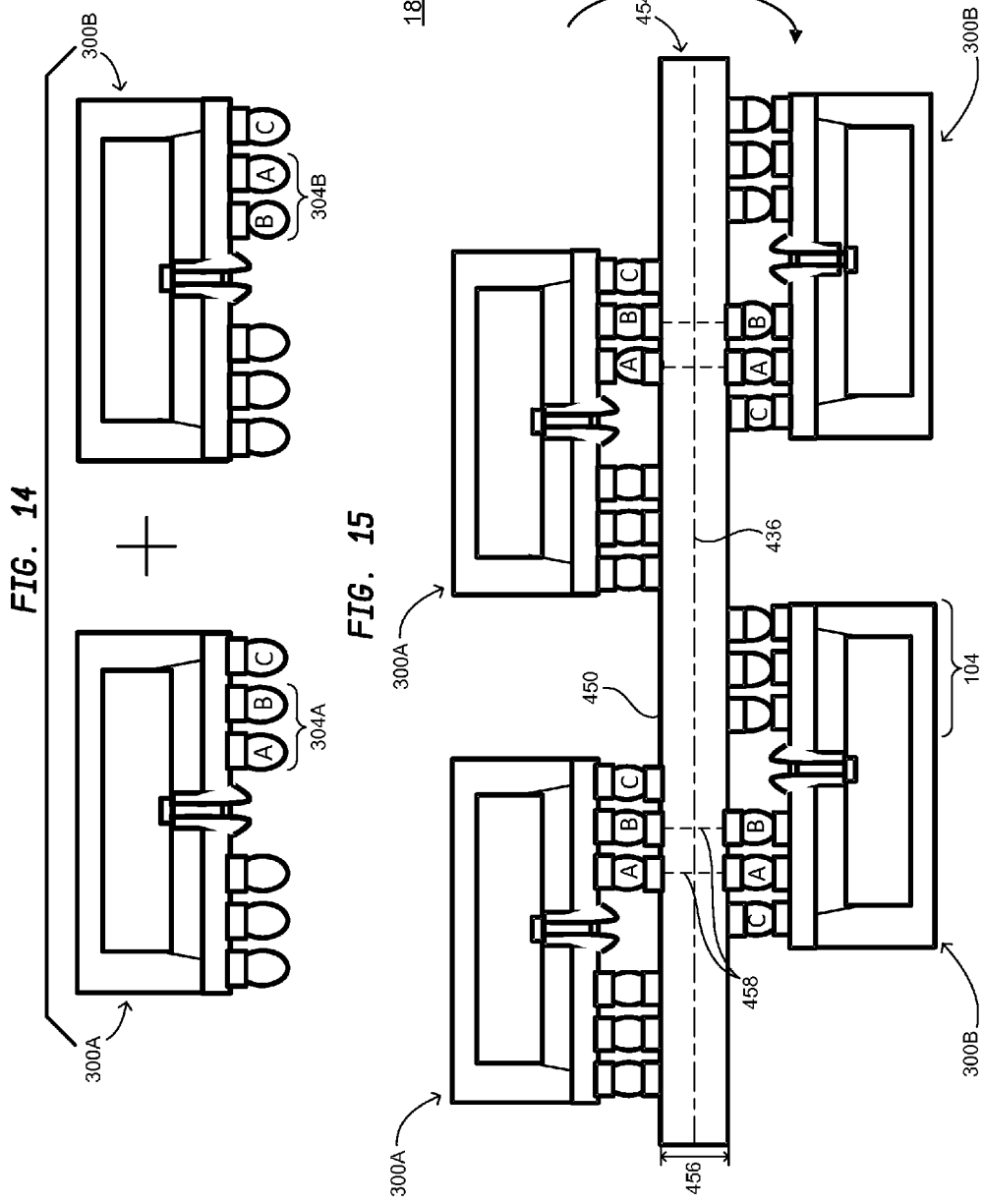

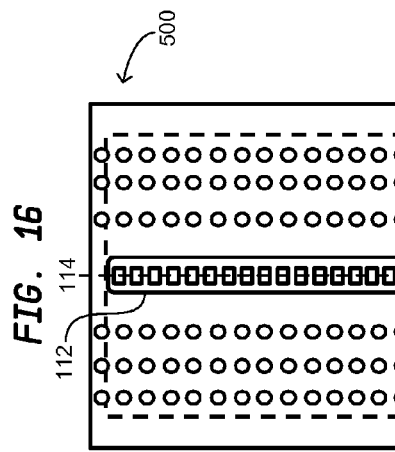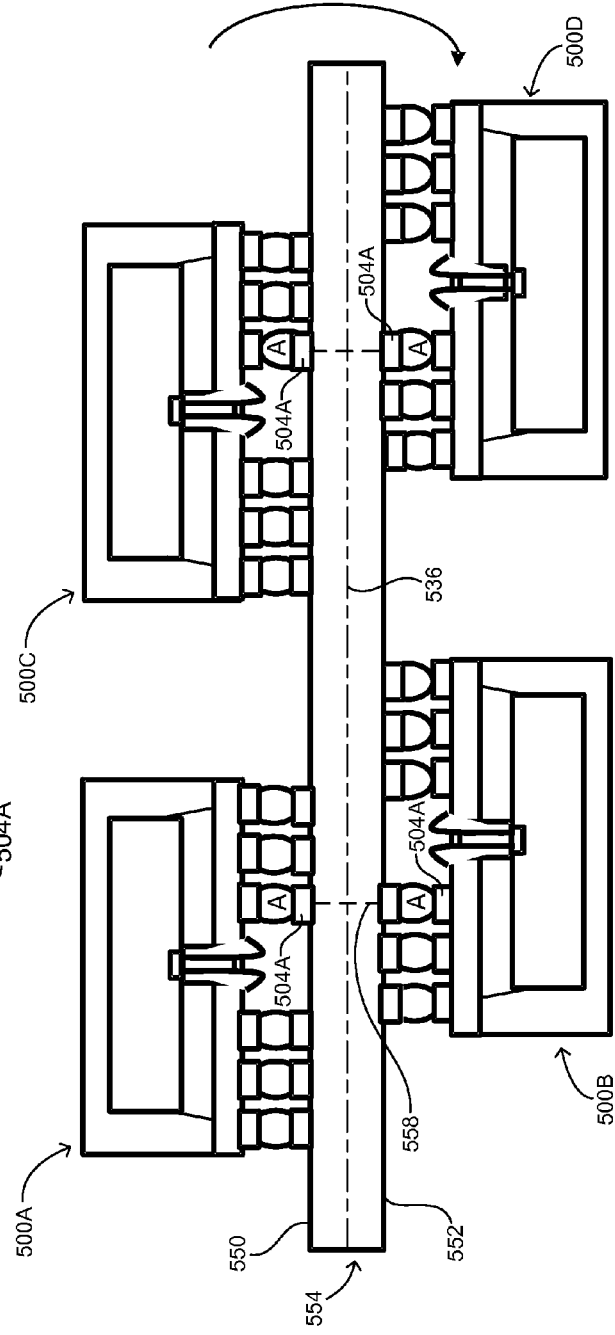

US 8,917,532 B2

STUB MINIMIZATION WITH TERMINAL GRIDS OFFSET FROM CENTER OF PACKAGE

CROSS-REFERENCE TO RELATED APPLICATION

This application claims the benefit of the filing date of U.S. Provisional Application No. 61/542,495 filed Oct. 3, 2011, the disclosure of which is incorporated herein by reference.

BACKGROUND OF THE INVENTION

The subject matter of the present application relates to microelectronic packages and assemblies incorporating microelectronic packages.

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

In "flip chip" designs, the front face of the chip confronts the face of a package dielectric element, i.e., substrate of the package, and the contacts on the chip are bonded directly to contacts on the face of the substrate by solder bumps or other connecting elements. In turn, the substrate can be bonded to a circuit panel through the external terminals which overlie the substrate. The "flip chip" design provides a relatively compact arrangement; each package occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference. Certain innovative mounting techniques offer compactness approaching or equal to that of conventional flip-chip bonding. Packages which can accommodate a single chip in an area of the circuit panel equal to or slightly larger than the area of the chip itself are commonly referred to as "chip-scale packages."

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components which form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips are commonly packaged in single- or multiple-chip packages and assemblies. Each package has many electrical connections for carrying signals, power and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds which extend in both horizontal and vertical directions relative to the surface of the chip.

Conventional microelectronic packages can incorporate a microelectronic element which is configured to predominantly provide memory storage array function, i.e., a microelectronic element that embodies a greater number of active devices to provide memory storage array function than any other function. The microelectronic element may be or include a DRAM chip, or a stacked electrically interconnected assembly of such semiconductor chips. Typically, all of the terminals of such package are placed in sets of columns adjacent to one or more peripheral edges of a package substrate to which the microelectronic element is mounted. For example, in one conventional microelectronic package 12 seen in FIG. 1, three columns 14 of terminals can be disposed adjacent a first peripheral edge 16 of the package substrate 20 and three other columns 18 of terminals can be disposed adjacent a second peripheral edge 22 of the package substrate 20. A central region 24 of the package substrate 20 in the conventional package does not have any columns of terminals. FIG. 1 further shows a microelectronic element 11 such as a semiconductor chip within the package having element contacts 26 on a face 28 thereof which are electrically interconnected with the columns 14, 18 of terminals of the package 12 through wire bonds 30 extending through an aperture, e.g., bond window, in the central region 24 of package substrate 20. In some cases, an adhesive layer 32 may be disposed between the face 28 of the microelectronic element 11 and the substrate 20 to reinforce the mechanical connection between the microelectronic element and the substrate, with the wire bonds extending through an opening in the adhesive layer 32.

In light of the foregoing, certain improvements in the positioning of terminals on microelectronic packages can be made in order to improve electrical performance, particularly in assemblies which include such packages and a circuit panel to which such packages can be mounted and electrically interconnected with one another.

SUMMARY OF THE INVENTION

In accordance with an aspect of the invention, a microelectronic package may include a substrate having first and second opposed surfaces, a peripheral edge extending between the first and second surfaces, and an aperture extending between the first and second surfaces. The aperture may an axis extending in a direction of a longest dimension of the aperture and centered relative to a width of the aperture in a direction transverse to the longest dimension. The axis may be parallel to the peripheral edge, with the second surface having a first region disposed between the axis and the edge.

The package can include a microelectronic element having memory storage array function. The microelectronic element may have a surface facing the first surface of the substrate and a plurality of contacts exposed at the surface of the microelectronic element aligned with the aperture.

A plurality of terminals can be exposed at the second surface of the substrate and configured for connecting the microelectronic package to at least one component external to the package. Leads can be electrically connected between the contacts of the microelectronic element and the terminals, the leads having portions aligned with the aperture.

The terminals can include first terminals exposed in the first region of the second surface of the substrate configured to carry all of the address signals transferred to the package.

In one example, the microelectronic element can embody a greater number of active devices to provide memory storage array function than any other function.

In one example, the first terminals can include terminals configured to carry all of the command signals, bank address signals, and clock signals transferred to the package, the command signals being write enable, row address strobe, and column address strobe signals, and the clock signals being sampling clocks used for sampling the address signals.

In one example, the substrate can be an element consisting essentially of a material having a CTE in a plane of the substrate less than 12 ppm/° C.

In one example, the substrate can include a dielectric element consisting essentially of a material having a CTE in a plane of the substrate less than 30 ppm/° C.

In one example, at least some of the terminals exposed in the first region of the second surface can be configured to carry signals other than the command signals, address signals, and clock signals.

In one example, the second surface can have a second peripheral edge extending between the first and second surfaces of the substrate and being opposite from the first peripheral edge. For example, the second peripheral edge can be parallel to the first peripheral edge and the axis. The second surface can have a second region between the axis and the second edge. The terminals may further include second terminals exposed at the second surface in the second region thereof.

In one example, the first terminals can be configured to carry all of the command signals, bank address signals, and clock signals transferred to the package, the command signals being write enable, row address strobe, and column address strobe signals, and the clock signals being sampling clocks used for sampling the address signals. In one example, at least some of the second terminals can be configured to carry signals other than the command signals, address signals, and clock signals.

In one example, the first terminals can be arranged in no more than three columns.

In one example, the columns can be parallel to the axis of the aperture.

In one example, the first terminals can be arranged in no more than two columns.

In one example, the first terminals can be arranged in first and second parallel columns.

In one example, the first terminals can be arranged in a single column.

In one example, at least some of the leads include wire bonds extending through the aperture.

In one example, all of the leads can be wire bonds extending through the aperture.

In one example, at least some of the leads include lead bonds.

In one example, the microelectronic element can be a dynamic random access memory ("DRAM") integrated circuit chip.

In one example, the terminals can be configured for connecting the microelectronic package to an external component being a circuit panel.

A microelectronic assembly according to an aspect of the invention can include a circuit panel having first and second opposed surfaces and panel contacts exposed at each of the first and second opposed surfaces. First and second microelectronic packages may have terminals mounted to the panel contacts exposed at the first and second surfaces, respectively. The circuit panel can electrically interconnect at least some terminals of the first microelectronic package with at least some corresponding terminals of the second microelectronic package.

In one example, each of the first and second microelectronic packages can include a substrate having first and second opposed surfaces, a peripheral edge extending between the first and second surfaces, and an aperture extending between the first and second surfaces and having an axis extending in a direction of the length of the aperture. The second surface may have a first region disposed between the axis and the edge.

In one example, a microelectronic element included in each package may have a surface facing the first surface of the substrate and a plurality of contacts exposed at the surface of the microelectronic element aligned with the aperture, the microelectronic element having memory storage array function.

A plurality of terminals of the package can be exposed at the second surface of the substrate and configured for connecting the microelectronic package to at least one component external to the package. Leads may be electrically connected between the contacts of the microelectronic element and the terminals, each lead having a portion aligned with the aperture.

The terminals may include first terminals exposed in the first region of the second surface of the substrate which are configured to carry all of the address signals transferred to the package.

In one example, the microelectronic element of each package may embody a greater number of active devices to provide memory storage array function than any other function.

In one example, the first terminals of each package can be configured to carry all of the command signals, bank address signals, and clock signals transferred to the package, the command signals being write enable, row address strobe, and column address strobe signals, and the clock signals being sampling clocks used for sampling the address signals.

In one example, the terminals of the first and second microelectronic packages can be arranged at corresponding positions of grids, respectively, the grids being aligned with one ball pitch of one another in x and y orthogonal directions parallel to the first and second circuit panel surfaces.

In one example, the grids can be aligned with one another in the x and y orthogonal directions such that the terminals of the grids are coincident with one another.

In one example, each position of each grid may be occupied by one of the terminals.

In one example, at least one position of each grid is not occupied by a terminal.

In one example, stub lengths of the electrical connections of the first and second packages can be less than seven times a minimum pitch of the first terminals of each package.

In one example, at least some of the electrical connections through the circuit panel between the first terminals of the first and second microelectronic packages may have an electrical length of approximately a thickness of the circuit panel.

In one example, the signal assignments of the first terminals in the grids can be the same on each of the first and second packages, and each of the grids may have first and second columns containing first terminals. Terminals of the first column of terminals on the first package can be aligned within one ball pitch in x and y orthogonal directions with terminals of the second column of terminals of the second package, and terminals of the second column of terminals of the first package can be aligned within one ball pitch in x and y orthogonal directions with terminals of the first column of terminals of the second package.

In one example, the total combined length of the conductive elements connecting a pair of electrically coupled first and second panel contacts exposed at the first and second surfaces of the circuit panel can be less than seven times a smallest pitch of the panel contacts.

In one example, the first terminals of each microelectronic package can be disposed at positions of a single column of terminals. In such example, the circuit panel may include no more than one routing layer for global routing of all of the command signals, address signals, bank address signals, and clock signals.

In one example, the first terminals of each microelectronic package can be disposed at positions of two parallel columns, and wherein the circuit panel includes no more than two routing layers for global routing of all of the command signals, address signals, bank address signals, and clock signals.

In one example, the circuit panel may have no more than one routing layer for global routing of all of the command signals, address signals, bank address signals, and clock signals.

A module according to an aspect of the invention may include a circuit panel, and one or more microelectronic packages mounted to and electrically connected with the circuit panel through terminals of each microelectronic package for transport of signals to and from each microelectronic package. Each microelectronic package may include a substrate having first and second opposed surfaces, a peripheral edge extending between the first and second surfaces, and an aperture extending between the first and second surfaces. The aperture may have an axis extending in a direction of the length of the aperture, the second surface having a first region disposed between the axis and the edge.

Each such package may include a microelectronic element having a surface facing the first surface of the substrate and a plurality of contacts exposed at the surface of the microelectronic element aligned with the aperture. The microelectronic element may have memory storage array function, and in one example, may embody a greater number of active devices to provide memory storage array function than any other function.

A plurality of terminals of each package can be exposed at the second surface of the substrate and configured for connecting the microelectronic package to at least one component external to the package. Leads can be electrically connected between the contacts of the microelectronic element and the terminals, each lead having a portion aligned with the aperture. The terminals can include first terminals exposed in the first region of the second surface of the substrate which can be configured to carry all of the address signals transferred to the package. In one example, the first terminals can be configured to carry all of the command signals, bank address signals, and clock signals transferred to the package, wherein the command signals are write enable, row address strobe, and column address strobe signals, and the clock signals are sampling clocks used for sampling the address signals.

In one example, a system can include a module such as described above and one or more other electronic components electrically connected therewith. The system may further include a housing, such module and other electronic components being assembled with the housing.

A microelectronic assembly according to a particular embodiment may include a circuit panel having first and second opposed surfaces and panel contacts exposed at each of the first and second opposed surfaces. First and second microelectronic packages can have terminals mounted to the panel contacts exposed at the first and second surfaces, respectively. The circuit panel may electrically interconnect at least some terminals of the first microelectronic package with at least some corresponding terminals of the second microelectronic package.

Each of the first and second microelectronic packages may include a substrate having first and second opposed surfaces, a peripheral edge extending between the first and second surfaces, and an aperture extending between the first and second surfaces and having an axis extending in a direction of the length of the aperture. The axis and the peripheral edge can be parallel. The second surface may have a first region disposed between the axis and the peripheral edge.

A microelectronic element having a surface facing the first surface of the substrate and a plurality of contacts exposed at the surface of the microelectronic element can be aligned with the aperture. In one example, the microelectronic element may embody a greater number of active devices to provide memory storage array function than any other function.

A plurality of terminals can be exposed at the second surface of the substrate and configured for connecting the microelectronic package to at least one component external to the package. Leads can be electrically connected between the contacts of the microelectronic element and the terminals, each lead having a portion aligned with the aperture. The terminals can include first terminals exposed in the first region of the second surface of the substrate which are configured to carry all of the command signals, address signals, bank address signals, and clock signals transferred to the package, the command signals being write enable, row address strobe, and column address strobe signals, and the clock signals being sampling clocks used for sampling the address signals.

Each position of each grid can be occupied by one of the terminals, wherein at least some of the electrical connections through the circuit panel between the first terminals of the first and second microelectronic packages have an electrical length of approximately a thickness of the circuit panel. Signal assignments of the first terminals in the grids can be the same on each of the first and second packages, and each of the grids may have first and second columns of terminals. The first terminals may be disposed at positions of only the first and second columns, wherein terminals of the first column of terminals on the first package can be aligned within one ball pitch in x and y orthogonal directions with terminals of the second column of terminals of the second package, and terminals of the second column of terminals of the first package can be aligned within one ball pitch in x and y orthogonal directions with terminals of the first column of terminals of the second package. A total combined length of the conductive elements connecting a pair of electrically coupled first and second panel contacts exposed at the first and second surfaces of the circuit panel may be less than seven times a smallest pitch of the panel contacts. In a particular example, the circuit panel may include no more than two routing layers for global routing of all of the command signals, address signals, bank address signals, and clock signals.

BRIEF DESCRIPTION OF THE DRAWINGS

FIG. 6 is a plan view further illustrating an arrangement of terminals on the microelectronic package according to the embodiment shown in FIG. 5.

FIG. 7 is a sectional view of the microelectronic package corresponding to plan view shown in FIG. 6.

FIG. 8 is an inset view illustrating electrically interconnecting leads in a microelectronic package according to a variation of that shown in FIG. 7.

FIG. 9 is a plan view illustrating possible positions and types of contacts on a microelectronic element in a variation of the embodiment shown in FIGS. 5, 6, and 7.

FIG. 14 is a sectional view illustrating first and second microelectronic packages having columns of first terminals with differing signal assignments, e.g., which can be mirror images of one other on the respective packages.

FIG. 15 is a sectional view illustrating a microelectronic assembly including a circuit panel and the first and second different microelectronic packages mounted opposite one another on opposite surfaces of the circuit panel.

FIG. 16 is a plan view illustrating a microelectronic package according to another variation of the embodiment shown in FIGS. 5 through 9.

FIG. 17 is a sectional view illustrating a microelectronic assembly including a circuit panel and a plurality of microelectronic packages as shown in FIG. 16 electrically interconnected therewith.

DETAILED DESCRIPTION

Figure 1:
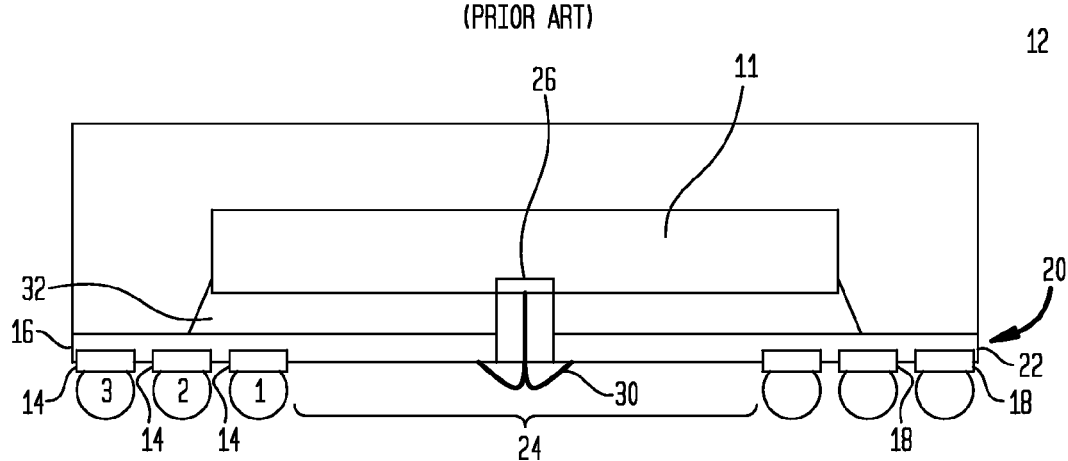
FIG. 1 is a sectional view illustrating a conventional microelectronic package containing a DRAM chip.

In view of the illustrative conventional microelectronic package 12 described relative to FIG. 1, the inventors have recognized improvements which can be made that may help improve the electrical performance of a package incorporating a memory storage array chip, and an assembly which incorporates such package.

Figure 2:
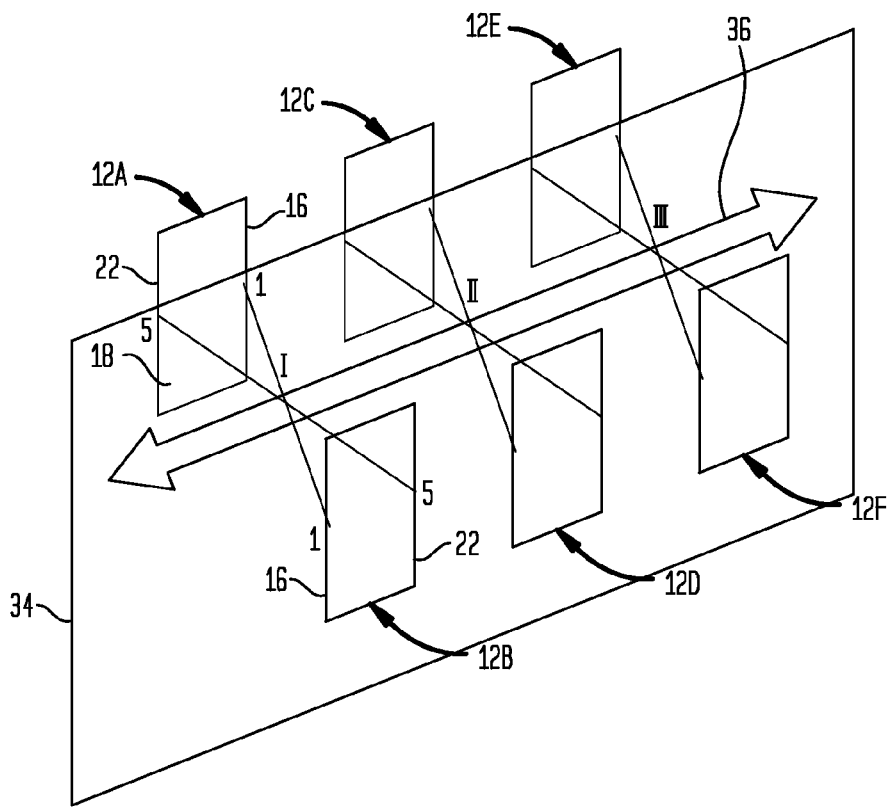
FIG. 2 is a diagrammatic schematic diagram illustrating a microelectronic assembly, e.g., a DIMM module, incorporating a circuit panel and a plurality of microelectronic packages mounted opposite one another to first and second opposite surfaces thereof.
Figure 3:
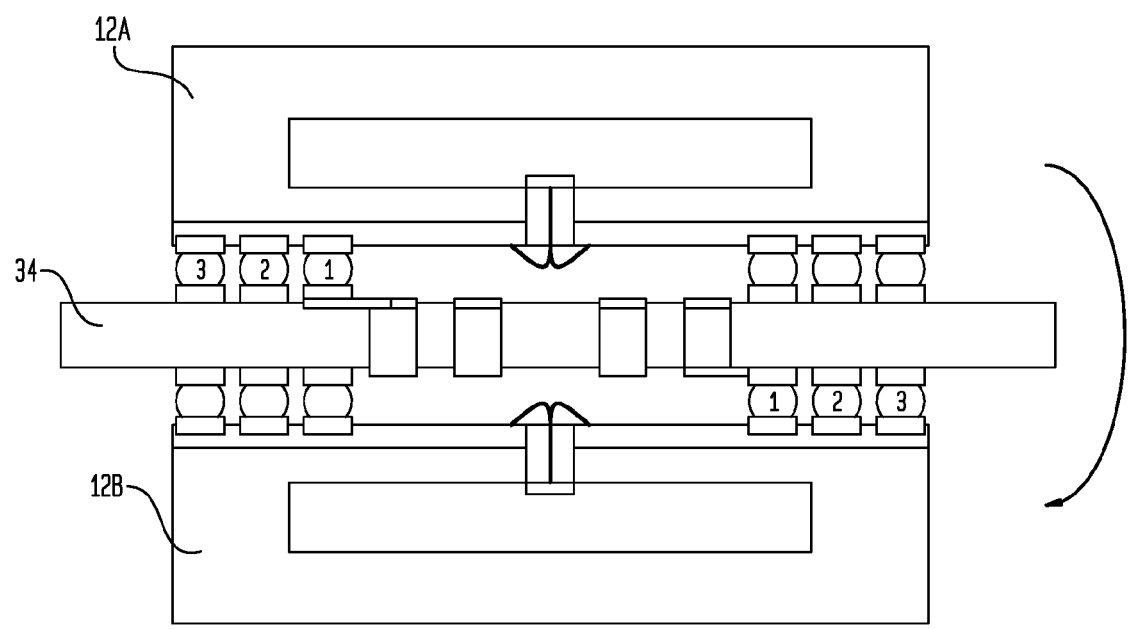
FIG. 3 is a sectional view further illustrating an electrical interconnection between first and second microelectronic packages and a circuit panel in an assembly such as shown in FIG. 2.
Figure 4:
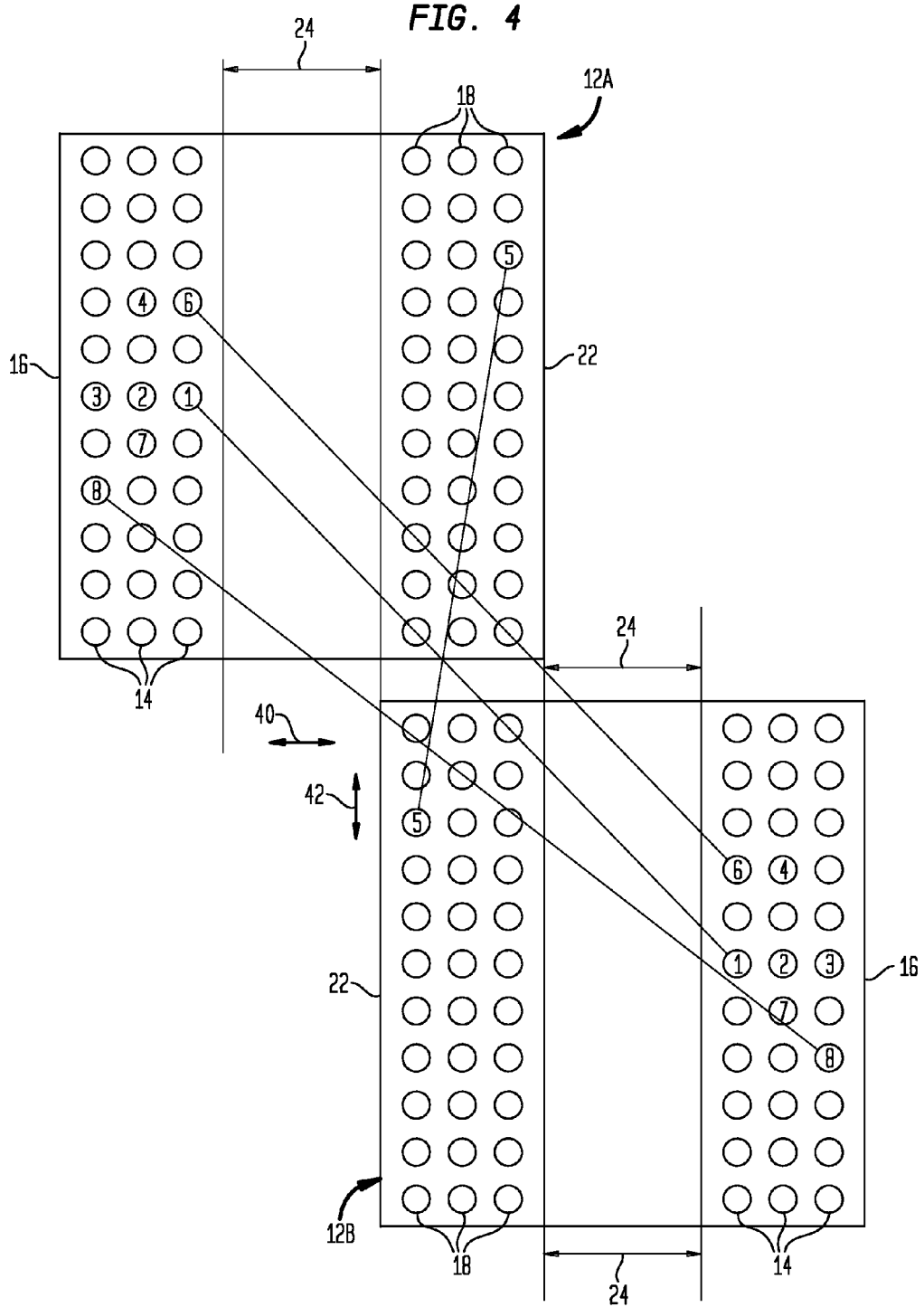
FIG. 4 is a diagrammatic plan view further illustrating the electrical interconnection between first and second microelectronic packages in an assembly such as shown in FIG. 2.

Improvements can be made particularly for use of a microelectronic package when provided in an assembly such as shown in FIGS. 2-4, in which a package 12A is mounted to a surface of a circuit panel with another like package 12B mounted opposite thereto on an opposite surface of the circuit panel. The packages 12A, 12B typically are functionally and mechanically equivalent to one another. Other pairs 12C and 12D; and 12E and 12F, of functionally and mechanically equivalent packages typically are also mounted to the same circuit panel 34. The circuit panel and the packages assembled thereto may form a portion of an assembly commonly referred to as a dual in-line memory module ("DIMM"). The packages in each oppositely mounted pair of packages, e.g., packages 12A, 12B, connect to contacts on opposite surfaces of the circuit panel so that the packages in each pair overlie one another typically by more than 90% of their respective areas. Local wiring within the circuit panel 34 connects terminals, e.g., the terminals labeled "1" and "5" on each package to global wiring on the circuit panel. The global wiring includes the signal conductors of a bus 36 used to conduct some signals to connection sites on the circuit panel 34 such as sites I, II and III. For example, packages 12A, 12B are electrically connected to the bus 36 by local wiring coupled to a connection site I, packages 12C, 12D are electrically connected to the bus by local wiring coupled to connection site II, and packages 12E, 12F are electrically connected to the bus by local wiring coupled to connection site III.

The circuit panel 34 electrically interconnects the terminals of the respective packages 12A, 12B using local interconnect wiring that appears similar to a crisscross or "shoelace" pattern in which a terminal labeled "1" near one edge of package 12A connects through the circuit panel 34 to a terminal labeled "1" of package 12B near the same edge 16 of package 12B. However, the edge 16 of package 12B as assembled to circuit panel 34 is far from the edge 16 of package 12A. FIGS. 2-4 further shows that a terminal labeled "5" near an edge 22 of package 12A is connected through the circuit panel 34 to a terminal labeled "5" of package 12B near the same edge 22 of package 12B. In assembly 38 the edge 22 of package 12A is far from the edge 22 of package 12B.

Connections through the circuit panel between terminals on each package, e.g., package 12A, to the corresponding terminals on the package mounted opposite thereto, i.e., package 12B, are fairly long. As further seen in FIG. 3, in such assembly of like microelectronic packages 12A, 12B, the circuit panel 34 may electrically interconnect a signal conductor of the bus 36 with the terminal of package 12A marked "1" and the corresponding terminal of package 12B marked "1", when the same signal from the bus is to be transmitted to each package. Similarly, the circuit panel 34 may electrically interconnect another signal conductor of the bus 36 with the terminal of package 12A marked "2" and the corresponding terminal of package 12B marked "2". The same connection arrangement may also apply to other signal conductors of the bus and corresponding terminals of each package. Local wiring between the bus 36 on the circuit panel 34 and each package of the respective pair of packages, e.g., packages 12A, 12B (FIG. 2) at a connection site I of the board can be in form of unterminated stubs. Such local wiring when relatively long may in some cases impact the performance of the assembly 38 as discussed below. Moreover, the circuit panel 34 also requires local wiring to electrically interconnect certain terminals of other packages: the pair of packages 12C and 12D, and the pair of packages 12E and 12F to the global wiring of the bus 36, and such wiring can also impact the performance of the assembly in the same way.

FIG. 4 further illustrates the interconnection between microelectronic packages 12A, 12B of respective pairs of terminals assigned to carry signals "1", "2", "3", "4", "5", "6", "7", and "8". As seen in FIG. 4, because the columns 14, 18 of terminals are near the edges 16, 22, respectively, of each package 12A, 12B, the wiring needed to traverse the circuit panel 34 in a direction 40 transverse to the direction 42 in which the columns 14, 18 of terminals extend can be quite long. In recognition that the length of a DRAM chip can be in the range of ten millimeters on each side, the length of the local wiring in a circuit panel 34 in an assembly 38 seen in FIGS. 2-4 required to route the same signal to the corresponding terminals of two oppositely mounted packages 12A, 12B can in some cases range between five and ten millimeters and may typically be about seven millimeters.

In some cases, relatively long unterminated wiring on a circuit panel which connects the terminals of a package may not severely impact the electrical performance of the assembly 38. However, when a signal is transferred from a bus 36 of the circuit panel to each of multiple pairs of packages connected to the circuit panel as shown in FIG. 2, the inventors recognize that the electrical lengths of the stubs, i.e., the local wiring, that extend from the bus 36 to the terminal connected thereto on each package potentially impacts the performance of the assembly 38. Signal reflections on the unterminated stubs can travel in the reverse direction from the connected terminals of each package back onto the bus 36, and thus degrade the signals being transferred from the bus 36 to the packages. The impacts may be tolerable for some packages containing microelectronic elements of current manufacture. However, in present or future assemblies which operate with increased signal switching frequencies, low voltage swing signals or both, the inventors recognize that the impacts can become severe. For these assemblies, settling time, ringing, jitter, or intersymbol interference of a transmitted signal may increase to an unacceptable degree.

The inventors further recognize that the electrical lengths of the unterminated stubs are usually longer than the local wiring that connects the bus 36 on the circuit panel with the terminals of the packages mounted thereto. Unterminated wiring within each package from the package terminals to the semiconductor chip therein adds to the lengths of the stubs.

In a specific example, the bus 36 can carry address information. The bus can be a command-address bus of an assembly having a predominant memory storage array function such as a DIMM. The command-address bus 36 carries a set of command signals, address signals, bank address signals and clock signals on the circuit panel to connection sites, e.g., sites I, II, and III shown in FIG. 2. These command-address bus signals can then be distributed by local wiring to respective sets of panel contacts on opposite surfaces of the circuit panel, to which packages 12A, 12B, 12C, 12D, 12E and 12F are connected. The clock signals are sampling clock signals used for sampling the address signals. In a particular example, when the microelectronic element is or includes a DRAM chip, the command signals are write enable, row address strobe and column address strobe.

Accordingly, certain embodiments of the invention described herein provide a microelectronic package configured so as to permit the lengths of stubs to be reduced when first and second such packages are mounted opposite one another on opposite surfaces of a circuit panel, e.g., a circuit board, module board or card, or flexible circuit panel. Assemblies which incorporate first and second microelectronic packages mounted opposite one another on a circuit panel can have significantly reduced stub lengths between the respective packages. Reducing the stub lengths within such assemblies can improve electrical performance, such as by reducing one or more of settling time, ringing, jitter, or intersymbol interference, among others. Moreover, it may be possible to obtain other benefits as well, such as simplifying the structure of the circuit panel or reducing the complexity and cost of designing or manufacturing the circuit panel, or for both designing and manufacturing the circuit panel.

A microelectronic package includes a substrate having first and second opposed surfaces, i.e., surfaces of the substrate which face in opposite directions. A peripheral edge extends between the first and second surfaces. An aperture, e.g., a bond window, extends between the first surface and a second surface of the substrate opposite the first surface. The aperture has an axis extending in a direction of the length of the aperture, such that a first region of the second surface is disposed between the axis and the peripheral edge.

A microelectronic element, e.g., a semiconductor chip, has a face which faces the first surface of the substrate and has a plurality of contacts exposed at its face which are aligned with the aperture. The microelectronic element may have memory storage array function. In one example, the microelectronic element can embody a greater number of active devices to provide memory storage array function than any function. The face of the microelectronic element faces a first surface of a substrate to which the microelectronic element typically is mounted, such as with an adhesive.

The microelectronic package has terminals exposed at the second surface of the substrate which are configured for connecting the microelectronic package to at least one component external to the package. As used herein, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure can project from such surface; can be flush with such surface; or can be recessed relative to such surface and exposed through a hole or depression in the structure. Leads are electrically connected between the terminals and the contacts of the microelectronic element, each lead having a portion aligned with the aperture.

The terminals include terminals 104 exposed in the first region 140 of the second surface of the substrate. First terminals are configured to carry all of a group of command-address bus signals. The signals carried by the first terminals include signals carrying address information. In one example, when the microelectronic element includes or is a DRAM chip, the first terminals can be configured to carry all of a group of command signals, address signals, bank address signals and clock signals, wherein the command signals are write enable, row address strobe, and column address strobe, and the clock signals are sampling clocks used for sampling the address signals. While the clock signals can be of various types, in one embodiment, the clock signals carried by the first terminals can be one or more pairs of differential clock signals received as differential or true and complement clock signals.

As will be described further below, these signals carried by the first terminals can be command-address bus signals which are bussed on a circuit panel such as a printed circuit board or module card to multiple microelectronic packages in parallel, particularly to first and second microelectronic packages mounted to opposite surfaces of the circuit panel. For certain embodiments herein, by placing the first terminals which carry command-address bus signals between an axis 114 of the bond window 112 and a peripheral edge 150 of the substrate parallel to the axis, it is possible to reduce the lengths of stubs in microelectronic packages attached to the command-address bus signal conductors on a circuit panel to which first and second such microelectronic packages are mounted on opposite surfaces of the circuit panel. These stubs on the circuit panel can be reduced to relatively short lengths when first and second packages are mounted on first and second opposite surfaces of the circuit panel such that a grid of first terminals on the first package is aligned within one ball pitch in x and y orthogonal direction along the first surface of the circuit panel with a grid of first terminals of the second package. The stub lengths on the circuit panel can be further reduced when a number of columns of the first terminals on each package are reduced. Thus, when the first terminals of each of the first and second packages are arranged in a single column, the connections in the circuit panel between corresponding first terminals of each package can have a length approximately the same as a thickness of the circuit panel. Then, the lengths of the stubs between the signal conductors of the command-address bus on the circuit panel and the first terminals of the first and second packages are comparably short; for example, the stubs may have a length which is less than the thickness of the circuit panel. Reducing the lengths of stubs that connect the signal conductors of the command-address bus on the circuit panel with the first terminals on the packages electrically connected thereto can improve electrical performance in such assembly. Thus, reducing stub lengths may help reduce one or more of settling time, ringing, jitter, and intersymbol interference, among others.

The microelectronic package may have second terminals 106 other than the above-described first terminals. In one example, the second terminals may be disposed in the first region 140 where the first terminals are also disposed. Alternatively, some or all of the second terminals may be disposed in a second region 142 of the second surface between the axis 114 of the substrate and a second peripheral edge 152 of the substrate opposite the first peripheral edge 150. In one example, the second terminals can include terminals used for carrying uni-directional or bi-directional data signals to and or from the microelectronic element, and data strobe signals, as well as data masks and ODT or "on die termination" signals used to turn on or off parallel terminations to termination resistors. Signals or reference potentials such as chip select, reset, power supply voltages, e.g., Vdd, Vddq, or ground, e.g., Vss and Vssq, can be carried either by terminals in the first region 140 or second region 142; none of these particular signals or reference potentials must be carried by terminals in the first region. In the description which follows, terminals of the package which are configured to carry reference potentials such as power or ground, while present in the package, may be omitted from the figures and description for clarity and ease of description.

Figure 5:
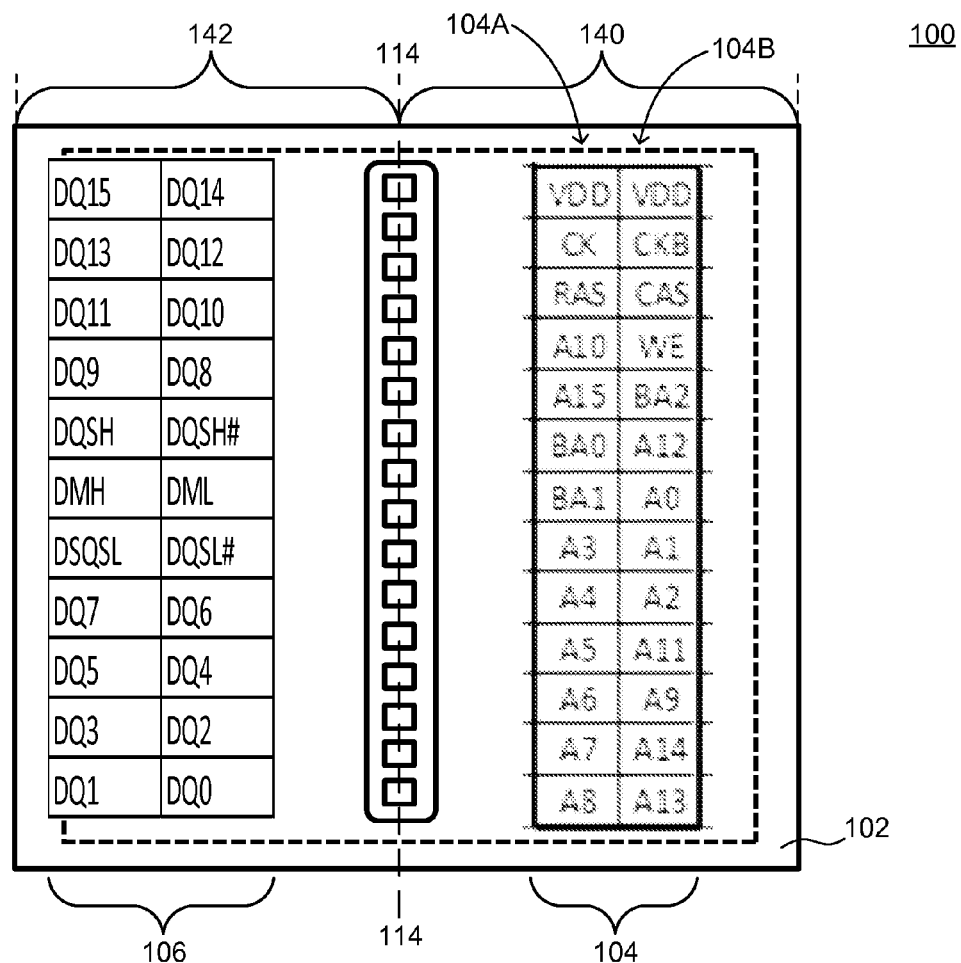
FIG. 5 is a diagrammatic plan view illustrating an arrangement and signal assignment of terminals in a microelectronic package according to an embodiment of the invention.

Thus, a microelectronic package 100 according to an embodiment of the invention is illustrated in FIGS. 5, 6 and 7. The microelectronic package includes a substrate 102 which may include a dielectric element. In some cases the dielectric element may be sheet-like, consisting essentially of polymeric material, e.g., a resin or polyimide, among others. Alternatively, the substrate can include a dielectric element having a composite construction such as glass-reinforced epoxy, e.g., of BT resin or FR-4 construction. In one example, the dielectric element may consist essentially of a material having a coefficient of thermal expansion ("CTE") in a plane of the substrate which is less than 30 parts per million per degree Celsius. In another example, the substrate can include a supporting element of material having a relatively low CTE of less than 12 parts per million per degree Celsius, on which the terminals and other conductive structure are disposed. For example, such low CTE element can consist essentially of glass, ceramic or semiconductor material or liquid crystal polymer material, or a combination of such materials.

The substrate has first and second opposed surfaces 108 and 110, and an aperture 112, e.g., a bond window extending between the first and second surfaces. The aperture may have an axis 114 extending in a direction of a longest dimension 116, that is, a length of the aperture and centered relative to a width of the aperture in a direction parallel to the second surface and transverse to the length. The axis can be centered with respect to one or more columns 134 of the contacts 132 of the microelectronic element which are aligned with the aperture and, which during a process of packaging a microelectronic element are exposed and accessible through the aperture. Alternatively or in addition thereto, the axis 114 may extend in a direction of a longest dimension 118, that is, a length of a column 134 of contacts 132 of the microelectronic element 130.

The microelectronic element can have memory storage array function. In one example, the microelectronic element 130 may embody a greater number of active devices to provide memory storage array function that any other function. For example, the microelectronic element may be a semiconductor chip which embodies a greater number of active devices to provide dynamic random access memory ("DRAM") storage array function. In particular examples, the microelectronic element may be a specialized DRAM chip, or may be one which incorporates a DRAM storage array and other function, such as processor function, signal processor function, graphics processor function, among others, but in which there are a greater number of active devices, e.g., transistors, to provide the memory storage array function than any other function.

As seen in FIG. 7, the microelectronic element 130 has a face 136 facing the first surface 108 of the substrate 102. An adhesive 138 may be disposed between the face 136 and the first surface 108, bonding them together. As seen in FIGS. 5, 6 and 7, the package 100 includes a plurality of first terminals 104 and may include second terminals 106 exposed at the second surface 110 of the substrate. The terminals can be electrically conductive pads, posts, pins, or any other electrically conductive structure exposed at the second surface of the package which are end points on the microelectronic package for electrically and mechanically connecting the package to another component external to the package, such as to a circuit panel, for example. The terminals may or may not include a bonding metal or bonding material thereon. For example, in the package seen in FIG. 7, the first and second terminals 104, 106 may include joining elements 154 attached thereto, the joining elements including an electrically conductive bond metal or bond material suitable for electrically and mechanically joining the terminals with corresponding contacts of a circuit panel. In one example, the joining elements can be solder balls.

The contacts 132 of the microelectronic element and the terminals are electrically connected with leads 160. As shown in FIG. 7, the leads can include portions which are aligned with the aperture 112. In one example, to connect the leads to the contacts 132 of the microelectronic element, a tool can be inserted into the aperture 112 to join a lead, e.g., a wire bond or beam lead to a contact 132 which is exposed and accessible through the aperture. For example, the leads 160 can be wire bonds as shown in FIG. 7, wherein the wire bonds extend through the aperture 112 from the contacts 132 to connection points (not shown) at the second surface 110 of the substrate. Alternatively, as seen in FIG. 8, the leads can be beam leads 162 connected to the terminals, the beam leads having portions parallel to or exposed at the second surface 110 of the substrate 102, and portions extending through the aperture 112 joined or bonded to the contacts 132. In another example, beam leads 164 connected to the terminals 104, 106 can have portions parallel to or exposed at the first surface 108 and having portions joined or bonded to the contacts 132.

The first terminals 104 of the package are exposed in a first region 140 of the second surface of the substrate which lies between the axis 114 and a first peripheral edge 150 of the substrate, the first peripheral edge 150 being parallel to the axis 114. In an example in which the microelectronic element is a dynamic random access memory storage device, the first terminals can be configured to carry all of the command signals, address signals, bank address signals and clock signals which are transferred to the microelectronic package. As mentioned above, the "command signals" are a write enable signal, row address strobe signal, and column address strobe signal utilized by a microelectronic element within the microelectronic package, when such microelectronic element is a dynamic random access memory storage device. "Clock signals" are those signals used as sampling clocks for sampling the address signals. For example, as seen in FIG. 5, the first terminals can include clock signals CK and CKB, row address strobe RAS, column address strobe CAS and write enable signals WE, as well as address signals A0 through A15 inclusive, and bank address signals BA0, BA1 and BA2. Although not specifically shown in FIG. 5, the terminals disposed in the first region 140 may also include terminals configured to carry other signals, e.g., data signals, data strobe signals, power or ground potentials, ODT, or clock enable signals, among others.

As further shown in FIG. 6, the first terminals may be arranged in a limited number of columns extending in a direction parallel to the axis 114 of the aperture. Thus, in one example, there may be three or fewer columns 104A, 104B, 104C of terminals in the first region 140. Further, the first terminals which are configured to carry the above-noted signals of the command-address bus may be arranged in the same number of columns which are the total number of columns of terminals in first region 140. Alternatively, the first terminals which are configured to carry the above-noted signals of the command-address bus may be arranged in a fewer number of columns than the total number of columns of terminals in first region 140. For example, referring to FIGS. 5, 6 and 7, all of the above-noted command-address bus signals may be carried by first terminals disposed at positions of the first and second parallel columns 104A, 104B, while a third column 104C of terminals can be configured to carry at least some signals other than the above-noted command-address bus signals.

It may not be necessary for one, or two or more columns 104A, 104B, 104C of the terminals to be configured only for carrying the above-noted command-address bus signals. Thus, it may be possible for some of the above-noted command-address bus signals to be carried by the terminals in one or more of the first, second, or third columns 104A, 104B, 104C while signals other than the above-noted command-address bus signals are also carried by the terminals in one or more of the first, second or third columns 104A, 104B, 104C.

Second terminals 106 can be exposed in a second region 142 of the second surface 110 which lies between the axis 114 and a second peripheral edge 152 of the substrate opposite the first peripheral edge. The second terminals can be configured to carry signals other than the above-noted signals of the command-address bus, e.g., data signals, data strobe signals, power or ground potentials, ODT, or clock enable signals, among others. It may also be possible for some or all of the above-noted signals of the command-address bus to also be carried by the second terminals 106 so long as there are first terminals 104, i.e., terminals in the first region 140, which are configured, that is, assigned to carrying each of the above-noted command-address bus signals.

As further seen in FIG. 6, a minimum pitch 154 exists as the smallest distance between any two adjacent parallel columns 104A, 104B of first terminals on the substrate. The minimum pitch 156 is defined as the minimum distance between centerlines 124A, 124B extending through the respective adjacent columns in a direction 158 parallel to the axis 114. The minimum pitch is in a direction 159 perpendicular to the direction 158 in which the terminals in a particular column, e.g., column 104A are arranged.

As further shown in FIG. 9, the microelectronic element 130A in the microelectronic package 100 may have an alternative configuration. In such configuration, the microelectronic element 130A may have two or more columns of contacts, e.g., columns 134A, 134B aligned with the aperture 112 (FIG. 6) and available to be electrically connected with the terminals by leads in the above-described manner. As shown in FIG. 9, one of the columns 134B may not be fully populated, such that a contact 132 is missing at one or more positions within the column 134B. FIG. 9 further shows that in addition to the terminals aligned with the aperture 112, the microelectronic element can have other contacts which are suitable for connection to power, ground or as contacts suitable for contact with a probe instrument such as for testing.

Figure 10:
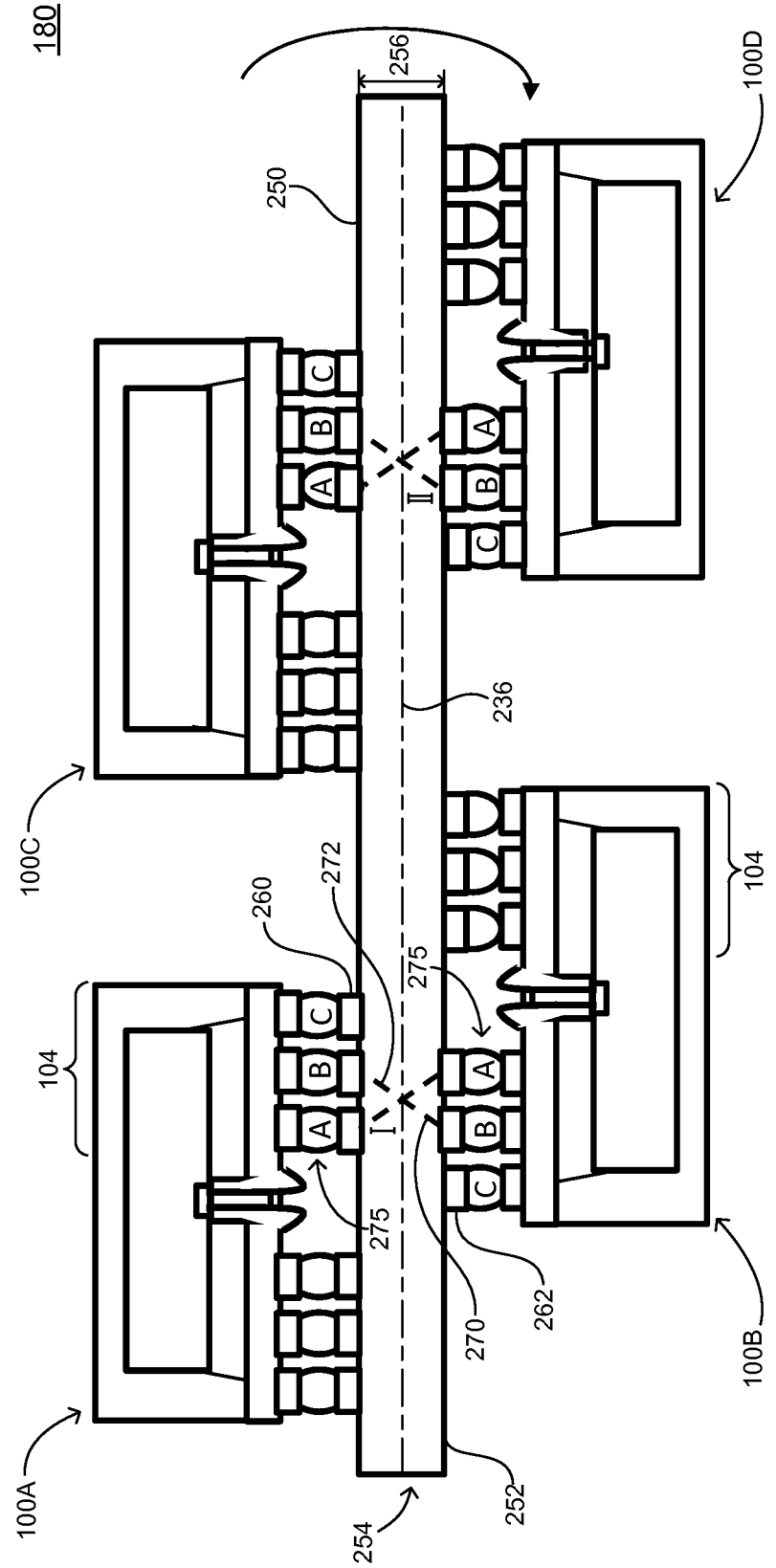
FIG. 10 is a sectional view illustrating a microelectronic assembly according to one embodiment which includes a circuit panel and a plurality of microelectronic packages as shown in FIGS. 5-9 electrically interconnected therewith.

FIG. 10 illustrates a microelectronic assembly 180 of first, second, third, and fourth microelectronic packages 100A, 100B, 100C, 100D, each being a microelectronic package 100 as described with reference to FIGS. 5-9 above, as mounted and electrically connected to contacts 260, 262 at opposite first and second surfaces 250, 252, respectively of a circuit panel 254. The circuit panel can be of various types, such as a printed circuit board used in a dual inline memory module ("DIMM") module, a circuit board or panel to be connected with other components in a system, or a motherboard, among others. The circuit panel includes contacts configured for electrically connecting the microelectronic packages. Thus, the circuit panel may electrically connect packages 100A, 100B mounted to panel contacts 260, 262 at the first and second surfaces 250, 252, respectively through electrically conductive traces and vias (shown schematically at 270, 272) thereon. The electrically conductive vias and traces on the circuit panel include local wiring electrically connected with the signal conductors of the command-address bus 236, which are global wiring of the circuit panel.

In a particular embodiment, the circuit panel may include an element having a relatively low coefficient of thermal expansion ("CTE") of less than 12 parts per million per degree Celsius ("ppm/° C."). In one example, the low CTE element may consist essentially of semiconductor, glass, ceramic or liquid crystal polymer material.

In the example shown in FIG. 10, first terminals of the first package 100A including those referenced as "A", and "B", are arranged at positions of a grid 275 of terminals having two columns 104A, 104B (FIGS. 5, 6 and 7). This grid then may be a subset of a larger grid 104 of terminals on the first package which also includes a third column 104C of terminals including a terminal referenced as "C" in FIG. 10. The terminals in the third column need not be configured to carry signals of the command-address bus. Similarly, the first terminals of the second package 100B including those referenced as "A", and "B", are arranged in a grid 275 of first terminals having two columns 104A, 104B. This grid then may be a subset of a larger grid 104 of terminals on the second package 100B which also includes a third column 104C of terminals including a terminal referenced as "C" in FIG. 10. Again, the terminals in the third column 104C (FIGS. 5, 6, 7) of the second package 100B need not be configured to carry signals of the command-address bus. In one example, each grid of terminals may be fully populated, i.e., there being a terminal occupying each position of each grid. Alternatively, one or more positions of each grid may be unoccupied by a terminal.

As evident from FIG. 10, as assembled together with the circuit panel, the grid of the first package 100A which includes the two columns 104A, 104B containing first terminals can be aligned within one ball pitch of the grid of the second package 100B which includes the two columns 104A, 104B containing first terminals, in x and y orthogonal directions parallel to the surface 250 of the circuit panel. Specifically, "within one ball pitch" refers to a distance no greater than the minimum pitch 156 (FIG. 6) between adjacent columns of terminals on a package 100. In a particular example, the grids of each package 100A, 100B containing columns 104A, 104B containing first terminals may be coincident with one another.

As is apparent from FIG. 10, the wiring on the circuit panel 254 required to connect one of the first terminals labeled "A" of first package 100A with the corresponding first terminal labeled "A" of the second package 100B can be relatively short. Specifically, when each grid 275 on each package has two columns 104A, 104B, and the grids 275 are aligned in the above-described manner, then a terminal of the first column 104A of the first package 100A can be aligned within one ball pitch of a terminal of the second column 104B of the second package in x and y orthogonal directions parallel to the first surface 250 of the circuit panel, and a terminal of the second column 104B of the first package 100A can be aligned within one ball pitch of a terminal of the first column 104A of the second package 100B in x and y orthogonal directions parallel to the first surface 250 of the circuit panel.

Therefore, the electrical lengths of stubs on the circuit panel 254 which electrically connect a first terminal A of the first package 100A with the corresponding first terminal A on the second package 100B can be less than seven times a minimum pitch of the first terminals on each package, for example, less than seven times the pitch 156 between columns 104A, 104B of first terminals as shown in FIG. 6. Stated another way, the total combined length of the conductive elements connecting a pair of electrically coupled first and second panel contacts 260, 262 exposed at the first and second surfaces 250, 252, respectively of the circuit panel for electrically connecting the corresponding first and second panel contacts with the corresponding signal conductor of the global command-address bus can be less than seven times a smallest pitch of the panel contacts. In another example, the electrical length of the connection between a first terminal A of the first package 100A with the corresponding first terminal A on the second package 100B may be approximately the same as a thickness 256 of the circuit panel 254 between first and second surfaces 250, 252.

The reductions in the lengths of these electrical connections can reduce stub lengths in the circuit panel and the assembly, which can help improve the electrical performance, such as reducing one or more of settling time, ringing, jitter, or intersymbol interference, among others, for the above-noted command-address bus signals in the assembly 180.

The above-described electrical interconnections between the first and second packages 100A, 100B and the circuit panel 254 at a first connection site I with the command-address bus 236 may also apply to the electrical interconnections between the third and fourth packages 100C, 100D and the circuit panel 254 at a second connection site II with the command-address bus 236. Therefore, the lengths of the stubs which connect first terminals of each package to the command-address bus can be reduced in each case, thereby reducing one or more of settling time, ringing, jitter, or intersymbol interference, among others, for the above-noted command-address bus signals in the assembly 180.

Moreover, it may be possible to obtain other benefits as well, such as simplifying the structure of the circuit panel or reducing the complexity and cost of designing or manufacturing the circuit panel. That is, connections on the circuit panel may require fewer layers of wiring to interconnect first terminals of each package to the command-address bus on the circuit panel.

In addition, the number of global routing layers of wiring on the circuit panel required to route the signals along the command-address bus 236 of the circuit panel between connection sites I and II where respective pairs of microelectronic packages: i.e., a first pair of packages 100A and 100B, and a second pair 100C and 100D, etc., are connected can also be reduced when the microelectronic packages attached thereto are constructed according to the principles herein. Specifically, the number of global routing layers required to route such signals along the circuit panel may in some cases be reduced to two or fewer routing layers. In a particular example, there may be no more than one routing layer for global routing of all of the above-noted signals of the command-address bus: command signals, address signals, bank address signals, and clock signals. However, on the circuit panel, there may be a greater number of global routing layers used to carry signals other than the above-noted signals of the command-address bus.

Figure 11:
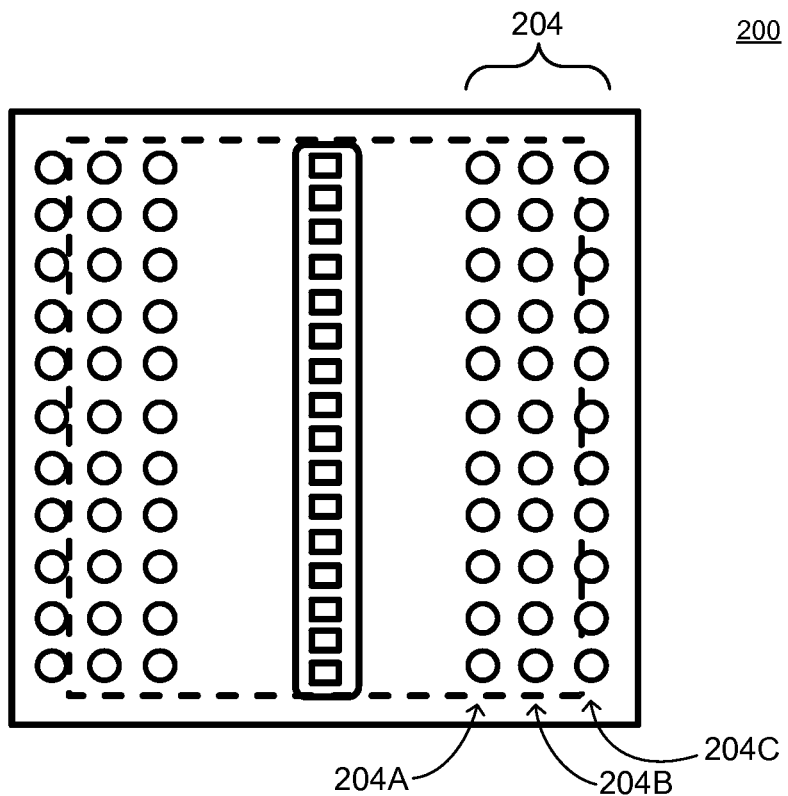
FIG. 11 is a plan view illustrating a microelectronic package according to a variation of the embodiment shown in FIGS. 5 through 9.
Figure 12:
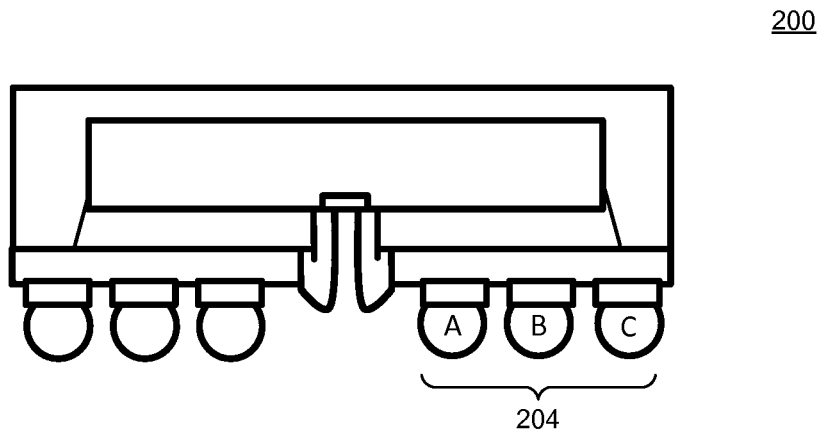
FIG. 12 is a sectional view of a microelectronic package corresponding to the plan view shown in FIG. 11.
Figure 13:
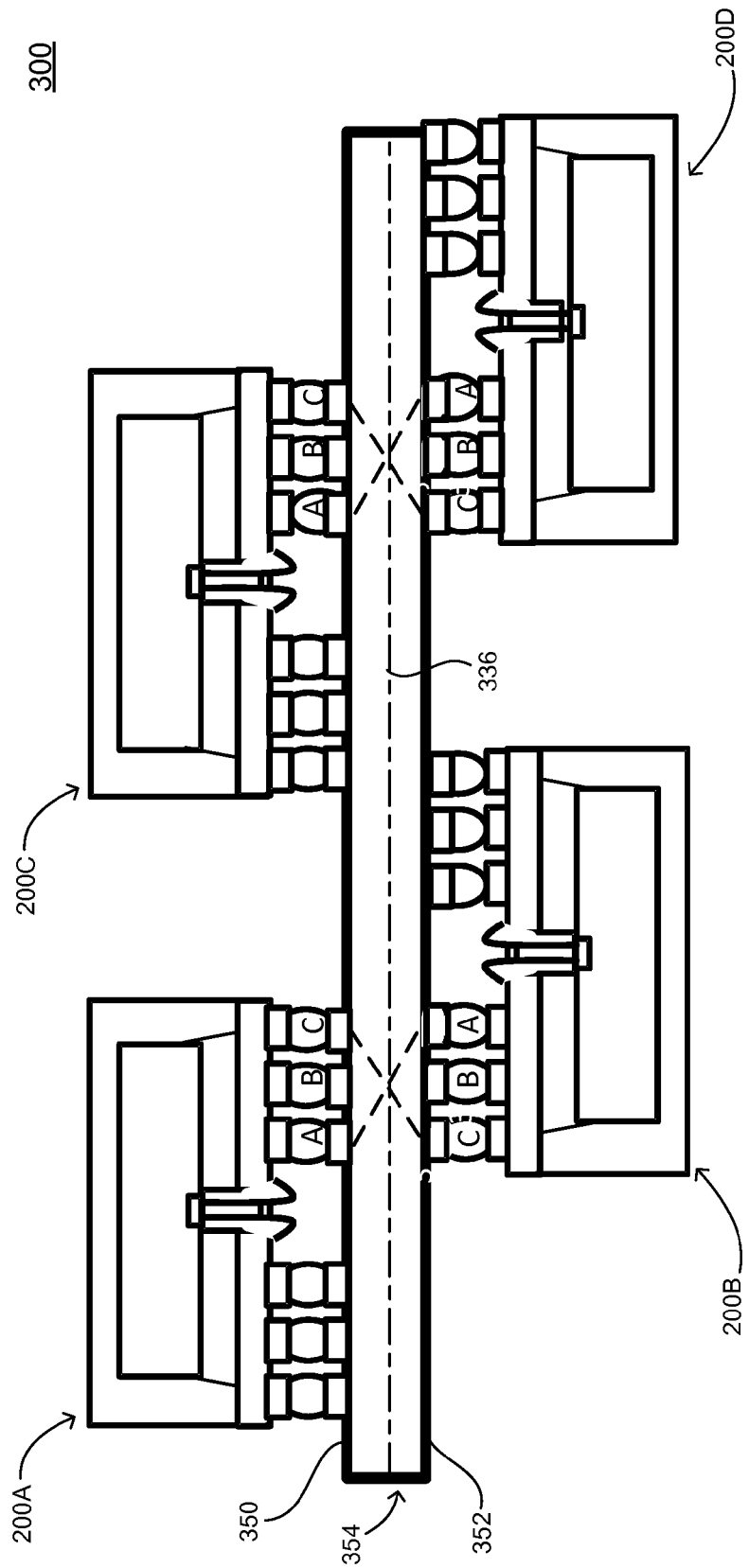
FIG. 13 is a sectional view illustrating a microelectronic assembly including a circuit panel and a plurality of microelectronic packages as shown in FIGS. 11-12 electrically interconnected therewith.

FIGS. 11 and 12 illustrate a microelectronic package 200 according to a variation of the embodiment described above in which the first terminals which are configured to carry the above-noted command address bus signals can be arranged at positions of three columns 204A, 204B and 204C of a grid 204 instead of two columns as described above. When first and second packages 200A, 200B are mounted to opposite surfaces of a circuit panel 354 and electrically interconnected with the circuit panel as shown in FIG. 13, the grids containing the three columns containing the first terminals including terminals A, B and C, respectively on the first and second packages 200A, 200B can be aligned within one ball pitch of one another in x and y orthogonal directions parallel to the first surface 350 of the circuit panel 354. In such arrangement, the stub lengths between the signal conductors of the command-address bus 336 and the column of first terminals including terminal "B" may be especially short, since the terminal "B" the first and second packages can be within one ball pitch of one another, or coincident with one another. FIG. 13 further illustrates that one or more additional pairs of packages, e.g., the pair 200C and 200D, can have the same interconnection relationship with one another and with the circuit panel as the first and second packages.

In another example (not shown), it is also possible for the first terminals of a microelectronic package which are configured to carry the above-noted signals of the command-address bus to be arranged in four or more columns.

FIG. 14 illustrates that in a variation of the above-described microelectronic package 100 (FIGS. 5-9), packages can be provided having respective grids 304A, 304B with different signal assignments of first terminals configured for carrying the above-noted command-address bus signals. In a particular example as seen in FIG. 14, the signal assignments of the first terminals in the grid 304B of the second package 300B are a mirror image of the signal assignments of the first terminals configured for carrying the command-address bus signals in the grid 304A of the first package 300A. Thus, as seen in FIG. 14, a first package 300A may have a first terminal grid 304A thereon having a first signal assignment in which terminal "A" is closest to the aperture 112 and terminal "B" is adjacent thereto but not the closest. By contrast, a second package 300B has a first terminal grid 304B thereon having a first signal assignment in which terminal "B" is closest to the aperture 112 and terminal "A" is adjacent thereto but not the closest.

These alternative package variations 300A, 300B are mounted to opposite surfaces of a circuit panel and electrically interconnected with one another and the circuit panel as seen in FIG. 15. It can be seen that the electrical connection 458 between a first terminal "A" on a first package 300A and a corresponding first terminal "A" on a second package 300B can be mainly straight through the circuit panel 454 in a direction of the circuit panel's thickness 456 rather than horizontally, i.e., parallel to a first surface 450 of the circuit panel. Moreover, the connection between such terminal "A" and the corresponding signal conductor of the command-address bus 436 can also be mainly in the direction of the circuit panel's thickness. The same also applies to a first terminal "B" on the first package 300A and a corresponding first terminal "B" on a second package 300B electrically connected thereto and with the command-address bus 436 on the circuit panel.

However, as further seen in FIG. 15, a third column of terminals containing terminal "C" need not have the signal assignments mirrored between the first and second package types 300A, 300B. This can be so such as when the third column of first terminals in some cases does not include terminals configured to carry the above-noted command-address bus signals.

In the microelectronic package 500 illustrated in FIG. 16, a single column 504A containing first terminals is configured to carry all of the above-noted command-address bus signals. As shown in FIG. 16, the single column 504A can extend in a direction parallel to the axis 114 of the aperture 112.

FIG. 17 further illustrates an assembly of two such packages 500A and 500B are mounted to panel contacts exposed at opposite surfaces 550, 552, respectively of a circuit panel 554 and electrically interconnected with conductors of the command-address bus 536 of the circuit panel and with one another. In such assembly, the connections 558 between the command-address bus on the circuit panel and the single columns 504A containing first terminals on each package 500A, 500B are relatively short because the single columns 504A are aligned within one ball pitch of one another. Specifically, the alignment between the first terminals in the single columns 504A on each package 500A, 500B can be within one ball pitch of one another in x and y orthogonal directions parallel to the first surface 550 of the circuit panel. FIG. 17 further illustrates third and fourth microelectronic packages 500C and 500D each having a single column 504A of first terminals configured to carry all of the above-noted command-address bus signals, and which are electrically interconnected with the command-address bus 536 in like manner as for packages 500A, 500B.

In any of the embodiments described in the foregoing, the one or more second semiconductor chips can be implemented in one or more of the following technologies: DRAM, NAND flash memory, RRAM ("resistive RAM" or "resistive random access memory"), phase-change memory ("PCM"), magnetoresistive random access memory ("MRAM"), e.g. such as may embody tunnel junction devices, spin-torque RAM, static RAM ("SRAM") or content-addressable memory, among others.

Figure 18:
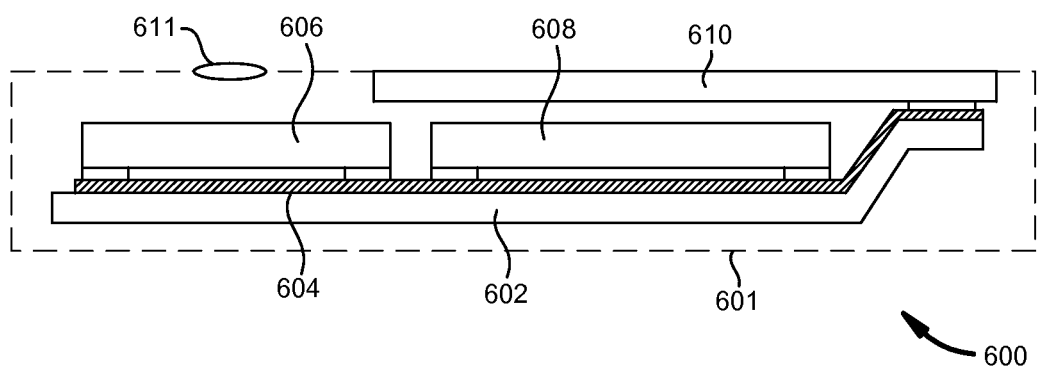
FIG. 18 is a schematic sectional view illustrating a system according to an embodiment of the invention.

The structures discussed above can be utilized in construction of diverse electronic systems. For example, a system 600 in accordance with a further embodiment of the invention includes a microelectronic package or structure 606 as described above in conjunction with other electronic components 608 and 610. In the example depicted, component 608 can be a microelectronic package or a semiconductor chip whereas component 610 is a display screen, but any other components can be used. Of course, although only two additional components are depicted in FIG. 18 for clarity of illustration, the system may include any number of such components. The structure 600 as described above may be, for example, a microelectronic package as discussed above in connection with any of above-described embodiments. In a further variant, both may be provided, and any number of such packages can be used. Package 606 and components 608 and 610 are mounted in a common housing 601, schematically depicted in broken lines, and are electrically interconnected with one another as necessary to form the desired circuit. In the exemplary system shown, the system includes a circuit panel 602 such as a flexible printed circuit panel or circuit board, and the circuit panel includes numerous conductors 604, of which only one is depicted in FIG. 18, interconnecting the components with one another. However, this is merely exemplary; any suitable structure for making electrical connections can be used. The housing 601 is depicted as a portable housing of the type usable, for example, in a cellular telephone or personal digital assistant, and screen 610 is exposed at the surface of the housing. Where structure 606 includes a light-sensitive element such as an imaging chip, a lens 611 or other optical device also may be provided for routing light to the structure. Again, the simplified system shown in FIG. 18 is merely exemplary; other systems, including systems commonly regarded as fixed structures, such as desktop computers, routers and the like can be made using the structures discussed above.

Various features of the above-described embodiments of the invention can be combined in ways other than as specifically described above without departing from the scope or spirit of the invention. It is intended for the present disclosure to cover all such combinations and variations of embodiments of the invention described above.

What is claimed is:

1. A microelectronic package, comprising:

a substrate having first and second opposed surfaces, a peripheral edge extending between the first and second surfaces, and an aperture extending between the first and second surfaces, the aperture having an axis extending in a direction of a longest dimension of the aperture and centered relative to a width of the aperture in a direction transverse to the longest dimension, the second surface having a first region disposed between the axis and the edge;

a microelectronic element having memory storage array function, the microelectronic element having a surface facing the first surface of the substrate and a plurality of contacts exposed at the surface of the microelectronic element aligned with the aperture;

a plurality of terminals exposed at the second surface of the substrate and configured for connecting the microelectronic package to at least one component external to the package; and leads electrically connected between the contacts of the microelectronic element and the terminals, the leads having portions aligned with the aperture, wherein the terminals include first terminals exposed in the first region of the second surface of the substrate configured to carry all of the address signals transferred to the package.

2. A microelectronic package as claimed in claim 1, wherein the microelectronic element embodies a greater number of active devices to provide memory storage array function than any other function.

3. A microelectronic package as claimed in claim 2, wherein the first terminals include terminals configured to carry all of the command signals, bank address signals, and clock signals transferred to the package, the command signals being write enable, row address strobe, and column address strobe signals, and the clock signals being sampling clocks used for sampling the address signals.

4. A microelectronic package as claimed in claim 1, wherein the substrate is an element consisting essentially of a material having a CTE in a plane of the substrate less than 12 ppm/° C.

5. A microelectronic package as claimed in claim 1, wherein the substrate includes a dielectric element consisting essentially of a material having a CTE in a plane of the substrate less than 30 ppm/° C.

6. A microelectronic package as claimed in claim 3, wherein at least some of the terminals exposed in the first region of the second surface are configured to carry signals other than the command signals, address signals, and clock signals.

7. A microelectronic package as claimed in claim 1, wherein the second surface has a second peripheral edge extending between the first and second surfaces of the substrate and being opposite from the first peripheral edge, the second surface having a second region between the axis and the second edge, wherein the terminals further include second terminals exposed at the second surface in the second region thereof.

8. A microelectronic package as claimed in claim 7, wherein the first terminals are configured to carry all of the command signals, bank address signals, and clock signals transferred to the package, the command signals being write enable, row address strobe, and column address strobe signals, and the clock signals being sampling clocks used for sampling the address signals, and wherein at least some of the second terminals are configured to carry signals other than the command signals, address signals, and clock signals.

9. A microelectronic package as claimed in claim 1, wherein the first terminals are arranged in no more than three columns.

10. A microelectronic package as claimed in claim 9, wherein the columns are parallel to the axis of the aperture.

11. A microelectronic package as claimed in claim 1, wherein the first terminals are arranged in no more than two columns.

12. A microelectronic package as claimed in claim 11, wherein the first terminals are arranged in first and second parallel columns.

13. A microelectronic package as claimed in claim 1, wherein the first terminals are arranged in a single column.

14. A microelectronic package as claimed in claim 1, wherein at least some of the leads include wire bonds extending through the aperture.

15. A microelectronic package as claimed in claim 14, wherein all of the leads are wire bonds extending through the aperture.

16. A microelectronic package as claimed in claim 1, wherein at least some of the leads include lead bonds.

17. A microelectronic package as claimed in claim 1, wherein the microelectronic element is a dynamic random access memory ("DRAM") integrated circuit chip.

18. The microelectronic package as set forth in claim 1, wherein the terminals are configured for connecting the microelectronic package to an external component being a circuit panel.

19. A microelectronic assembly, comprising a circuit panel having first and second opposed surfaces and panel contacts exposed at each of the first and second opposed surfaces;

and first and second microelectronic packages having terminals mounted to the panel contacts exposed at the first and second surfaces, respectively, the circuit panel electrically interconnecting at least some terminals of the first microelectronic package with at least some corresponding terminals of the second microelectronic package, each of the first and second microelectronic packages including:

a substrate having first and second opposed surfaces, a peripheral edge extending between the first and second surfaces, and an aperture extending between the first and second surfaces and having an axis extending in a direction of the length of the aperture, the second surface having a first region disposed between the axis and the edge;

a microelectronic element having a surface facing the first surface of the substrate and a plurality of contacts exposed at the surface of the microelectronic element aligned with the aperture, the microelectronic element having memory storage array function;

a plurality of terminals exposed at the second surface of the substrate and configured for connecting the microelectronic package to at least one component external to the package; and leads electrically connected between the contacts of the microelectronic element and the terminals, each lead having a portion aligned with the aperture, wherein the terminals include first terminals exposed in the first region of the second surface of the substrate configured to carry all of the address signals transferred to the package.

20. The microelectronic assembly as claimed in claim 19, wherein in each microelectronic package, the microelectronic element embodies a greater number of active devices to provide memory storage array function than any other function.

21. The microelectronic assembly as claimed in claim 20, wherein the first terminals are configured to carry all of the command signals, bank address signals, and clock signals transferred to the package, the command signals being write enable, row address strobe, and column address strobe signals, and the clock signals being sampling clocks used for sampling the address signals.

22. The microelectronic assembly as claimed in claim 19, wherein the terminals of the first and second microelectronic packages are arranged at corresponding positions of grids, respectively, the grids being aligned with one ball pitch of one another in x and y orthogonal directions parallel to the first and second circuit panel surfaces.

23. The microelectronic assembly as claimed in claim 22, wherein the grids are aligned with one another in the x and y orthogonal directions such that the terminals of the grids are coincident with one another.

24. The microelectronic assembly as claimed in claim 22, wherein each position of each grid is occupied by one of the terminals.

25. The microelectronic assembly as claimed in claim 22, wherein at least one position of each grid is not occupied by a terminal.

26. The microelectronic assembly as claimed in claim 22, wherein stub lengths of the electrical connections of the first and second packages are less than seven times a minimum pitch of the first terminals of each package.

27. The microelectronic assembly as claimed in claim 22, wherein at least some of the electrical connections through the circuit panel between the first terminals of the first and second microelectronic packages have an electrical length of approximately a thickness of the circuit panel.

28. The microelectronic assembly as claimed in claim 22, wherein the signal assignments of the first terminals in the grids are the same on each of the first and second packages, and each of the grids has first and second columns containing first terminals, wherein terminals of the first column of terminals on the first package are aligned within one ball pitch in x and y orthogonal directions with terminals of the second column of terminals of the second package, and terminals of the second column of terminals of the first package are aligned within one ball pitch in x and y orthogonal directions with terminals of the first column of terminals of the second package.

29. The microelectronic assembly of claim 28, wherein the total combined length of the conductive elements connecting a pair of electrically coupled first and second panel contacts exposed at the first and second surfaces of the circuit panel is less than seven times a smallest pitch of the panel contacts.

30. The microelectronic assembly as claimed in claim 21, wherein the first terminals of each microelectronic package are disposed at positions of a single column of terminals, and wherein the circuit panel includes no more than one routing layer for global routing of all of the command signals, address signals, bank address signals, and clock signals.

31. The microelectronic assembly as claimed in claim 21, wherein the first terminals of each microelectronic package are disposed at positions of two parallel columns, and wherein the circuit panel includes no more than two routing layers for global routing of all of the command signals, address signals, bank address signals, and clock signals.

32. A microelectronic assembly as claimed in claim 21, wherein there is no more than one routing layer for global routing of all of the command signals, address signals, bank address signals, and clock signals.

33. A module, comprising:
a circuit panel; and
a plurality of microelectronic packages mounted to, and electrically connected with the circuit panel through terminals of each microelectronic package for transport of signals to and from each microelectronic package, each microelectronic package including:
a substrate having first and second opposed surfaces, a peripheral edge extending between the first and second surfaces, and an aperture extending between the first and second surfaces and having an axis extending in a direction of the length of the aperture, the second surface having a first region disposed between the axis and the edge;
a microelectronic element having a surface facing the first surface of the substrate and a plurality of contacts exposed at the surface of the microelectronic element aligned with the aperture, the microelectronic element embodying a greater number of active devices to provide memory storage array function than any other function;
a plurality of terminals exposed at the second surface of the substrate and configured for connecting the microelectronic package to at least one component external to the package; and
leads electrically connected between the contacts of the microelectronic element and the terminals, each lead having a portion aligned with the aperture,
wherein the terminals include first terminals exposed in the first region of the second surface of the substrate configured to carry all of the command signals, address signals, bank address signals, and clock signals transferred to the package, the command signals being write enable, row address strobe, and column address strobe signals, and the clock signals being sampling clocks used for sampling the address signals.

34. A system including a module as claimed in claim 33, further comprising a housing, said module and a plurality of other electronic components being assembled with said housing.

* * * * *